United States Patent
Barker et al.

(10) Patent No.: US 11,959,993 B2
(45) Date of Patent: Apr. 16, 2024

(54) SYSTEM AND METHOD FOR ENABLING DETERMINATION OF A POSITION OF A RECEIVER WITHIN A SPACE

(71) Applicant: TAKEMETUIT INC., Kenora (CA)

(72) Inventors: Nick Barker, Durham (GB); Vimalkumar Bhandari, Calgary (CA); Christopher Henrikson, Chestermere (CA)

(73) Assignee: TAKEMETUIT INC., Kenora (CA)

( * ) Notice: Subject to any disclaimer, the term of this patent is extended or adjusted under 35 U.S.C. 154(b) by 1244 days.

(21) Appl. No.: 16/495,768

(22) PCT Filed: Mar. 19, 2018

(86) PCT No.: PCT/CA2018/050329
§ 371 (c)(1),
(2) Date: Sep. 19, 2019

(87) PCT Pub. No.: WO2018/170587
PCT Pub. Date: Sep. 27, 2018

(65) Prior Publication Data
US 2020/0110146 A1    Apr. 9, 2020

Related U.S. Application Data

(60) Provisional application No. 62/473,511, filed on Mar. 20, 2017, provisional application No. 62/585,139, filed on Nov. 13, 2017.

(51) Int. Cl.
*G01S 1/04* (2006.01)
*G01R 23/165* (2006.01)
(Continued)

(52) U.S. Cl.
CPC .......... *G01S 1/0428* (2019.08); *G01R 23/165* (2013.01); *G01S 1/045* (2013.01);
(Continued)

(58) Field of Classification Search
CPC .......... G01S 1/045; G01S 1/725; G01S 1/263; G01S 5/30; G01R 23/165; H04B 1/7136; H04W 16/14; H04W 64/006
(Continued)

(56) References Cited

U.S. PATENT DOCUMENTS 5,668,775 A    6/1997 Hatteland
9,618,604 B1 *    4/2017 Holt .......................... G01S 5/10
(Continued)

FOREIGN PATENT DOCUMENTS

WO    2014131894    9/2014

*Primary Examiner* — Harry K Liu
(74) *Attorney, Agent, or Firm* — Weiss & Moy, PC; Jeffrey D. Moy

(57) ABSTRACT

A method and system for enabling the determination of a position of a receiver within a space includes transmitting a beacon signal from each of a plurality of beacon devices located at different locations within the space. The beacon signal transmitted from each beacon device has a unique information component and may have a unique frequency pattern of multiple frequencies. Each beacon signal can be distinguishable from the beacon signals transmitted from any other of the beacon devices based on the combination of its unique information component and its unique frequency pattern. The beacon signals are received at a receiver. At the receiver, for each beacon signal of a working subset, time-delay information of the received beacon signal is determined and multilateration is applied to determine the position of the receiver based on the location of each beacon device of the working subset.

26 Claims, 10 Drawing Sheets

(51) Int. Cl.
*G01S 1/72* (2006.01)
*G01S 1/76* (2006.01)
*G01S 5/30* (2006.01)
*H04B 1/7136* (2011.01)
*H04W 16/14* (2009.01)
*H04W 64/00* (2009.01)

(52) U.S. Cl.
CPC .............. *G01S 1/725* (2013.01); *G01S 1/763* (2013.01); *G01S 5/30* (2013.01); *H04B 1/7136* (2013.01); *H04W 16/14* (2013.01); *H04W 64/006* (2013.01); *H04B 2001/71367* (2013.01)

(58) Field of Classification Search
USPC ......................................................... 342/387
See application file for complete search history.

(56) References Cited

U.S. PATENT DOCUMENTS

| | | |
|---|---|---|
| 9,716,980 B1 * | 7/2017 | Thiagarajan .............. G01S 5/30 |
| 2010/0228482 A1 | 9/2010 | Yonak |
| 2010/0309051 A1 | 12/2010 | Moshfeghi |
| 2013/0083631 A1 | 4/2013 | Harrell |
| 2015/0160330 A1 | 6/2015 | Booij et al. |
| 2017/0161769 A1 * | 6/2017 | Johnson ............. G06Q 30/0235 |

* cited by examiner

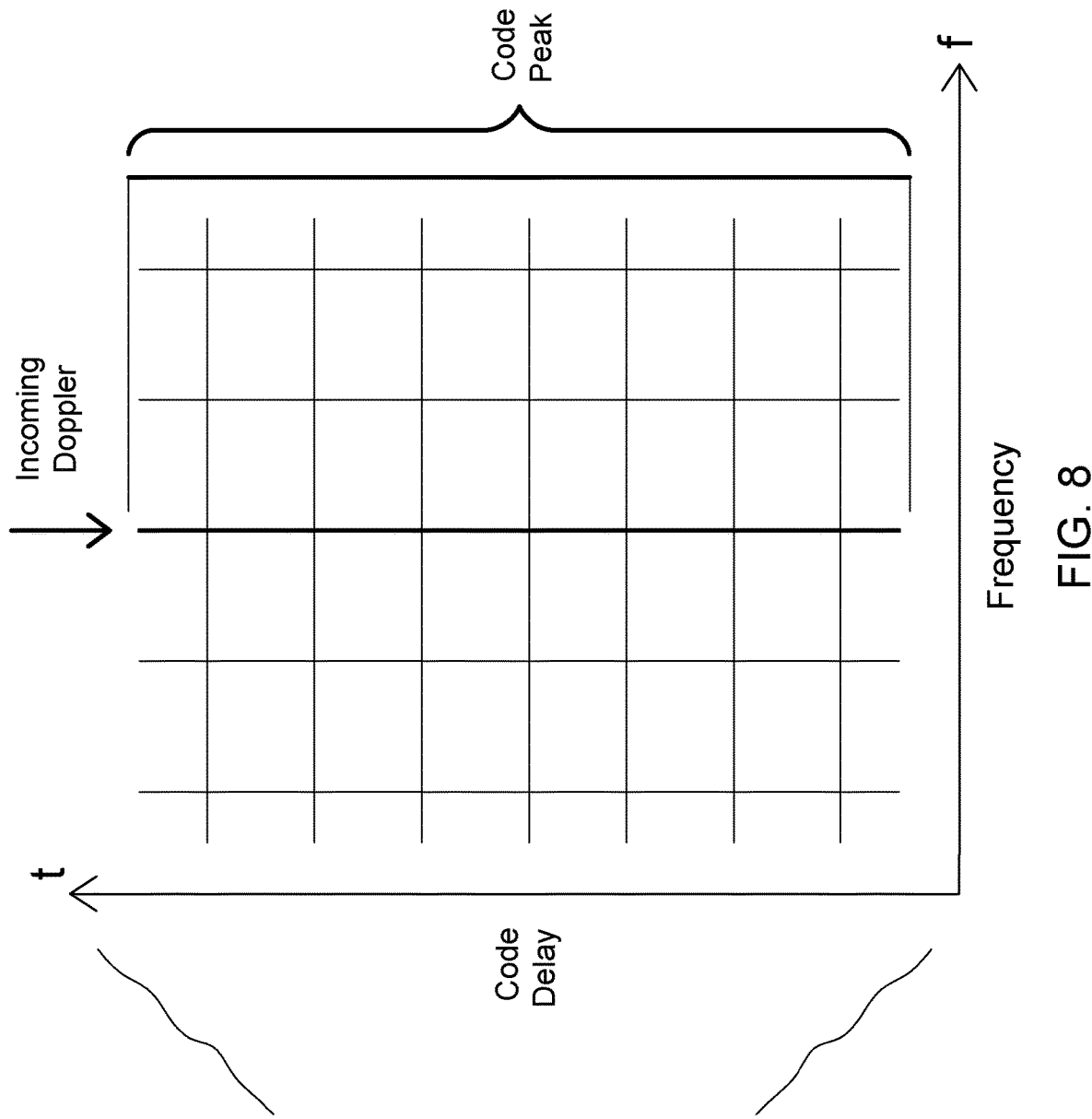

SYSTEM AND METHOD FOR ENABLING DETERMINATION OF A POSITION OF A RECEIVER WITHIN A SPACE

TECHNICAL FIELD

The technical field generally relates to systems and methods for enabling determination of a position of a receiver within a space, and more particularly, for enabling determination using beacon signals having a unique information component and a unique frequency pattern.

BACKGROUND

A global positioning system (GPS) relies on GPS signals received from overhead satellites to determine the current position of a receiver that receives the GPS signal. While the GPS signal provides sufficient accuracy in various outdoor applications, it is not well suited for indoor use.

A roof or ceiling obstructs GPS signals from being received indoors. Furthermore, GPS may not provide sufficient accuracy for certain applications.

SUMMARY OF THE INVENTION

According to one aspect, there is provided a method for enabling the determination of a position of a receiver within a space. The method includes providing a plurality beacon devices at different locations within said space and transmitting a beacon signal from each of the beacon devices, each beacon signal having a unique information component and a unique frequency pattern of multiple frequencies in the acoustic frequency range, each beacon signal being distinguishable from the beacon signals transmitted from any other of the beacon devices based on a combination of its unique information component and its unique frequency pattern.

According to another aspect, there is provided a system for enabling the determination of a position of receiver within a space. The system includes a plurality of beacon devices, each beacon device being configured to transmit a beacon signal having a unique information component and a unique frequency pattern of multiple frequencies, each beacon signal being distinguishable from the beacon signals transmitted from any other of the beacon devices based on a combination of its unique information component and its unique frequency pattern.

According to yet another aspect, there is provided a receiver device that includes a transducer configured to receive acoustic frequency signals, a filtering module configured for, for each of a plurality of beacon signals, filtering the received acoustic signals by the frequencies of a frequency pattern of the beacon signal to generate a filtered signal for the beacon signal, a correlation module configured for, for each of the plurality of beacon signals, carrying out a rolling correlation in time of the filtered signal of the beacon signal with a version of the information component of the beacon signal, a peak detector module configured for, for each of the plurality of beacon signals, identifying a correlation peak from the rolling correlation for the beacon signal, the correlation peak providing time-delay information for the beacon signal, and a multilateration module configured for determining a position of the receiver based on the locations of each of a plurality of beacon devices associated to the beacon signals and the time-delay information determined for the beacon signals.

According to yet another aspect, there is provided a method for enabling the determination of a position of a receiver within a space. The method includes receiving, at the receiver, acoustic frequency beacon signals each transmitted from a plurality of beacon devices located at different locations within the space, each beacon signal having a respective information component and each beacon signal being distinguishable from the beacon signals transmitted from any other of the beacon devices. Further, for each beacon signal received at the receiver and being transmitted from a working subset of at least three of the plurality of differently located beacon devices: carrying out a correlation in time of the received beacon signal with a version of the information component of the beacon signal and identifying a correlation peak from the correlation, the correlation peak providing time-delay information of the beacon signal. The method further includes applying multilateration to determine a position of the receiver based on the location of each beacon device of the working subset of beacon devices and the time-delay information of the beacon signals received from the working subset of beacon devices.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which:

FIG. 8 illustrates a graph showing a rolling correlation in the frequency domain;

Figure 1:
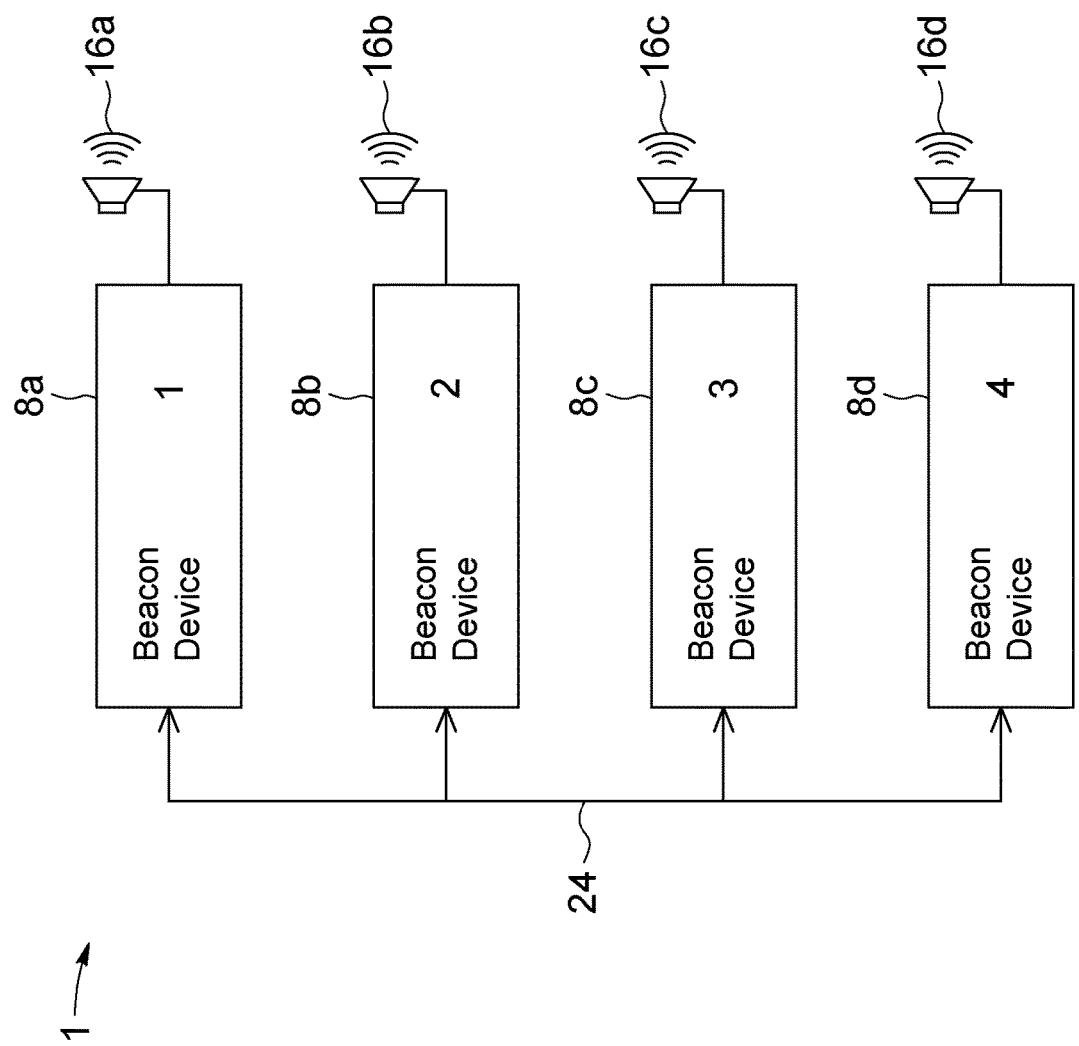
FIG. 1 illustrates a schematic diagram of a positioning-enabling system according to one example embodiment.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION

It will be appreciated that, for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way but rather as merely describing the implementation of the various embodiments described herein.

The positioning system and method described herein according to various example embodiments provide a plurality of beacon devices at different locations within a positioning-enabling space. Each beacon device transmits a respective beacon signal that is distinguishable from the beacon signal of any other beacon device. A subset of the beacon signals received by a receiver device enables that receiver device to determine its location within the space.

Implementations of the system and method described herein may advantageously be used in the context of determining a position of a receiver within an indoor space, such as a retail space, industrial space (ex: warehouse), public space (ex: library, museum), commercial space (ex: commercial offices, conference halls, or recreational space (ex: amusement parks). However, it should be understood that the system and method may be used in another medium other than air, such as in an underwater environment.

Beacon devices are pre-installed at various locations within the space and each transmits its unique beacon signal. A user, such as a customer, in the retail space uses a receiver, such as a smartphone, to receive the beacon signals and determines their current location based on known locations of the beacon devices. This determination of the position may be useful for the user to navigate to an item in the retail space that the user wishes to purchase. For example, a map of the retail space may be displayed on the receiver to show the current position of the user and the position of the item of interest. As the user moves about the retail space, the position of the user is updated and can show the user getting closer to item of interest. The indoor positioning space can also be useful in other applications, such as positioning within a warehouse for inventory management. However, it will be understood that example embodiments described herein for enabling determining of position within a space may be deployed in various applications, and is not limited to use in a retail space or warehouse.

In some implementations, the beacon device is an electronic device having a plurality of operational modules that may be implemented in hardware or software or a combination of both. The electronic device may include one or more programmable processing device, such as a microprocessor or microcontroller. The programmable processing device can be coupled to program memory, which stores instructions used to program the programmable processing device to control the operational modules.

Similarly, the receiver device may be an electronic device having a plurality of operational modules that may be implemented in hardware or software or a combination of both. The electronic device may include one or more programmable processing device, such as a microprocessor or microcontroller. The programmable processing device can be coupled to program memory, which stores instructions used to program the programmable processing device to control the operational modules. The receiver device may be a portable user device having a display device (ex: screen/monitor). For example, and without limitation, the receiver device may be a laptop, smartphone, wearable device such as a smartwatch or the like, tablet device, virtual reality device, or portable video game device.

Referring now to FIG. 1, therein illustrated is a schematic diagram of a positioning system 1 according to one embodiment. A plurality of beacon devices 8a, 8b, 8c, and 8d are provided. The beacon devices 8a, 8b, 8c, and 8d each have a transmitter and transmit beacon signals 16a, 16b, 16c, and 16d, respectively. The beacon devices 8a, 8b, 8c, and 8d may be interconnected over a network 24, which may be used to exchange information amongst the beacon devices. For example, the network 24 may be used to share timing information, such as to maintain timing synchronization amongst the beacon devices 8a, 8b, 8c, and 8d. By way of example, the network 24 may use the IEEE 1588 Precision Time Protocol (PTP) standard that provides clock synchronization.

It will be understood that while four beacons devices 8a, 8b, 8c, and 8d are illustrated in FIG. 1, the number of beacon devices used for enabling positioning within a positioning enabling space may vary. At least three beacon devices are required to enable determining a two-dimensional position of a receiver within the space. However, more beacon devices may be provided to provide adequate coverage of the space. The number of beacon devices used for a given space can depend on the size of the space, shape of the space, its configuration and/or layout of objects within the space.

In some example embodiments, at least 4 beacon devices are provided so as to enable determining a three-dimensional position.

In other example embodiments, less than three beacon devices may be used. For example, two beacon devices may be sufficient for positioning in one dimension (ex: determining a position along a long hallway or mineshaft). In some cases, a single beacon device may be sufficient for determining position if the beacon device and its receiver are synchronized in time.

Figure 2:
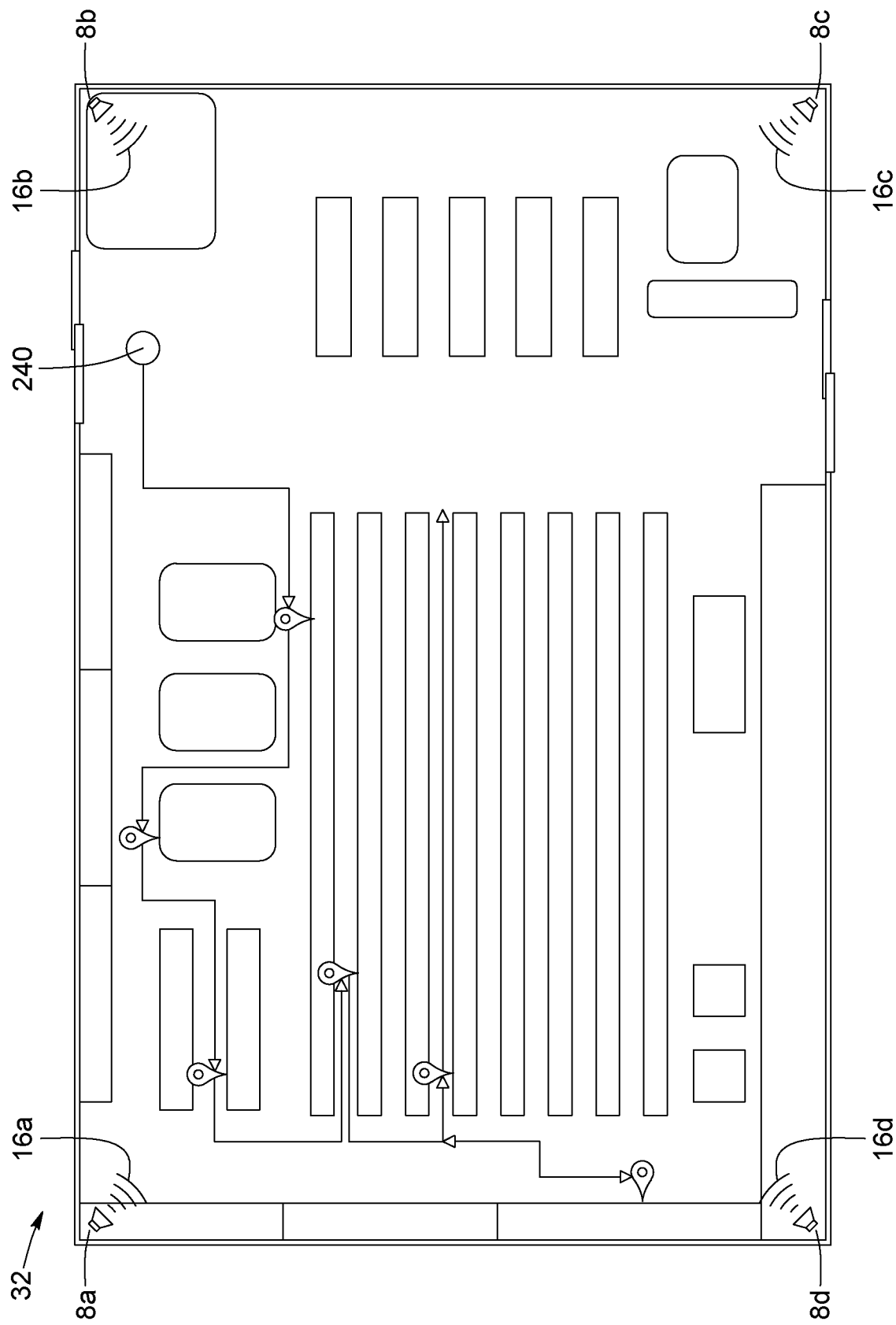
FIG. 2 illustrates a schematic diagram of a positioning enabled space according to one example embodiment having a plurality of beacon devices placed at different locations within the space.

Referring now to FIG. 2, therein illustrated is a schematic diagram of a positioning-enabling space 32 in which four beacon devices 8a, 8b, 8c, and 8d have been placed at different locations within the space 32. The beacon devices 8a, 8b, 8c, and 8d are transmitting beacon signals 16a, 16b, 16c, and 16d respectively.

Each beacon device of the positioning system transmits a beacon signal that allows a receiver device receiving that beacon signal to uniquely identify the beacon device that transmitted that beacon signal, as explained in more details further below. Furthermore, the receiver device is operable to determine time-delay information of the received beacon signal.

The time-delay information provides an indicator of the amount of time that elapsed between the transmission of an instance of the beacon signal from a given beacon device and the receiving of that instance of the beacon signal at the receiver device. The time-delay information may indicate an absolute time delay (i.e. the actual amount of time between the transmission and the reception) or a relative time-delay (i.e. the time delay relative to time delay of the receiving of beacon signals from other beacon devices). An instance of the beacon signal refers to a portion of the beacon signal that includes a single instance of the unique information component of the beacon signal. In various examples, the unique information component may be repeated in time within the beacon signal, and an instance of the beacon signal represents one repetition of the unique information component.

The receiver device is further operable to determine its current position within the positioning-enabling space 32 based on known locations of a working subset of the beacon devices and the time-delay information of beacon signals received from the beacon devices of the working subset. The working subset of the beacon devices may be understood as a subset of all of the beacon devices deployed within the positioning-enabling space 32 which provides sufficient information through their respective beacon signals to deduce the position of the receiving device within the positioning-enabling space 32. Beacon devices within the working subset may therefore refer to those beacon devices whose time-delay information and location information is currently being used by the receiver device to determine its current position. Beacon devices outside of the working subset are not currently being used by the receiver device to determine its current position. The members of the working subset may change, for example, as the receiver device is moved within the positioning-enabling space 32.

Each beacon device of the positioning system generally transmits a beacon signal having a unique information component and frequency pattern. At least the beacon signals transmitted from each beacon device of a working subset of beacon devices each have an information component that is unique and a frequency pattern that is unique with respect to the beacon signals from other beacons of the working subset. It will be appreciated that transmitting a beacon signal having a unique information component is applying a kind of code-division multiple access (CDMA).

The information component of a given beacon signal is unique in that the information component is different from the information component of any other beacon signals transmitted by beacon devices within the same positioning system 1 (or at least within the working subset).

The information component of a given beacon signal is generated from a unique raw information component for that beacon device. The unique raw information component is modified by the frequency pattern to generate the information component of that beacon signal.

According to one example embodiment, raw information component of a given beacon signal is a spread spectrum signal. The raw information component can have spread spectrum characteristics over a predetermined operating frequency range. For example, the raw information component of the given beacon signal may be a pseudo noise signal. The raw information component of the given beacon signal may for example be a coded message chosen from Gold codes, Kasami codes, multi-carrier codes, and maximum length sequence codes.

In some example embodiments, the predetermined operating frequency range may be in the acoustic frequency range. The acoustic frequency range herein refers to a frequency range defined by the possible frequencies of acoustic waves that are generated mechanically, such as by a transducer (ex: speaker). In some example embodiments, the acoustic frequency range may be limited to the human audible frequency range, generally accepted as below about 20 kHz. In other example embodiments, the acoustic frequency range may include ultrasonic waves.

In some example embodiments, the predetermined operating frequency range may be a range of frequencies of less than 1 MHz.

In some example embodiments, the predetermined operating frequency range may be a range of frequencies of less than 100 kHz.

In some example embodiments, the predetermined operating frequency range may be a range of frequencies between 20 kHz and 100 kHz.

Various embodiments are presented herein with reference to an acoustic frequency range for example purposes only, however it will be understood that the examples may also be applicable to the predetermined operating frequency range outside of the acoustic frequency range.

In some example embodiments, the predetermined operating frequency range may be a range below the radio frequency range. The systems and methods can further determine position of a receiver relative to the beacon devices of a working subset on an ongoing basis without use of a support radio frequency signal (ex: without the support of electromagnetic waves). That is, while radio frequency signals may be used to transmit information pertaining to the configuration of the system (ex: Initially transmitting location information and a copy of the information component of each beacon device of the system), positioning determination can then be continued without these radio frequency signals, including without use of electromagnetic waves. For example, radio frequency signals (ex: electromagnetic waves) are not used to determine positioning using multilateration.

The unique frequency pattern of multiple frequencies fall within the operating frequency range. In one example embodiment, the operating frequency range is divided into a plurality of frequency windows (i.e. frequency sub-ranges) and the unique frequency pattern is a subset of the frequency windows. The frequency pattern for each beacon signal is unique in that its subset of frequency windows is different from the subset of frequency windows of the frequency pattern of any other beacon signals transmitted by beacon devices within the same positioning system 1 (or at least within the working subset).

The raw information component for a given beacon signal is modified by the beacon signal in that the raw information component is only reproduced in the frequencies of the unique frequency pattern, while frequencies outside the frequency pattern are lost. For example, the raw information component can be sampled to obtain a representation thereof. The sampled raw information component can have a baseband bandwidth (i.e. highest frequency of the pattern) that is within the acoustic frequency range. Alternatively, upsampling may be applied.

According to one example embodiment, the given beacon signal to be transmitted can be generated from the raw information component by filtering the raw information component by the frequencies of the unique frequency pattern. Accordingly, the information component of the given beacon signal corresponds to the component that is representative of the raw information component, but the beacon signal only reproduces the raw information component using the frequencies of the frequency pattern. Therefore, the beacon signal is a partial reproduction of the raw information component. The beacon signal generated in this way is ready for transmission from the beacon device. The transmitter of the beacon device can be a transducer operable for transmitting acoustic signals, such as a speaker. It will be appreciated that the beacon signal is a baseband acoustic signal. Alternatively, the transmitter can be a transducer operable to transmit signals in the operating frequency range. It will be appreciated that modifying the beacon signal having a unique frequency pattern is applying a kind of frequency-division multiple access (FDMA).

In another example embodiment, the beacon signal to be transmitted can be generated from the raw information component by applying the frequency pattern as a carrier wave and by modulating the frequency pattern by the information component. Various modulation scheme known in the art may be applied, such as frequency shift keying, Gaussian frequency shift keying, chirped modulation, amplitude modulation, frequency modulation, quadrature amplitude modulation, orthogonal frequency division multiplexing.

Beacon signals generated according to embodiments described herein allow for a given beacon signal to be identified and distinguished from other beacon signals based on a combination of its unique information component and its unique frequency pattern. Various routines may be implemented to identify a given beacon signal generated and structured as described above.

In some implementations, a receiver device seeking to receive the beacon signal from a given beacon device may consider only the frequencies corresponding to the frequency pattern associated to that beacon device (ex: filtering a received spread spectrum signal in the acoustic frequency domain by the set of frequency windows of the frequency pattern associated to that beacon device). Accordingly, significant portions of beacon signals from other beacon devices are separated out within this first step, which provides a first level of identification/distinction.

In another example embodiment wherein the frequency pattern is modulated by the information component, demodulation by that frequency pattern can be applied to the information component.

The receiver device may then further determine if the information component of the received beacon signal presents a sufficient match with the raw information component associated to the given beacon device, which provides a second level of identification/distinction. The matching of the received beacon signal, which has an information component that is a representation of the raw information component, may be carried out by performing a correlation of the received beacon signal with a version of the raw information component associated to that beacon signal.

In various example embodiments, the raw information component is a digital code sequence. The raw information component is then sampled to generate a time-domain representation thereof. The raw information component may also be a non-digital code, such as a Zadoff-Chu code.

The sampling frequency may be the upper boundary of the operating frequency range (ex: 48 kHz for acoustic range). Alternatively, upsampling (ex: sampling frequency of 96 kHz, 192 kHz for acoustic range) may be applied to improve downstream accuracy. A Fourier transform (ex: Fast Fourier Transform FFT) may be applied to convert the sampled raw information component to obtain the frequency domain representation thereof. The frequency pattern for the given beacon signal is represented by a subset of all of frequency bins covering the operating frequency range. The frequency domain representation of the sampled raw information component is filtered by the frequency bins of the frequency pattern, such as by applying a comb filter. An inverse Fourier transform (ex: inverse FFT) is applied to obtain the beacon signal that is ready for transmission.

According to one example embodiment, the frequencies of the frequency pattern for each beacon signal is chosen to reduce harmonic relationships between frequencies within the same frequency pattern. For example, the frequencies of each frequency patter are chosen according to the constraint that no frequency of the pattern is an even harmonic of any other frequency of the pattern. For example, where an FFT is applied, the frequency pattern of each beacon signal may be formed of only odd-numbered frequency bins.

It was observed that reducing harmonic relationships when in the acoustic range reduces the effect of the beacon signal being audibly perceived as a tone (ex: like a musical note or chord), which may be unpleasant or distracting to a human user. Instead, the beacon signal is audibly perceived as being similar to white noise, which more easily blends into other background noises, such as an HVAC unit.

The frequencies of each frequency pattern may be chosen pseud-randomly subject to the constraints described herein for reducing harmonic relationships. Furthermore, the frequencies of each frequency pattern may be chosen to ensure that the frequencies are approximately evenly distributed over the operating frequency range.

The frequencies may be distributed linearly and evenly over the operating frequency range. It will be appreciated that treating the operating frequency range being the acoustic frequency range as a linear range is contrary to conventional logarithmic understanding of the acoustic frequency range. The logarithmic understanding aligns with human hearing, which perceives sound in octaves. Treating the frequency acoustic range logarithmically has the effect of shrinking the use of the acoustic range. For example, sound engineers often treat the upper range (ex: 10 kHz) as a single range because humans do not as easily distinguish higher notes within this range. By contrast, linearly distributing the frequencies makes full use of the acoustic range for distinguishing between beacon signals according to their respective frequency patterns. For example, by defining the frequency windows width of 10 Hz, the upper range of 10 kHz to 20 kHz can be separated into 1000 frequency windows that can be assigned to frequency patterns of the beacon signals.

Figure 3:
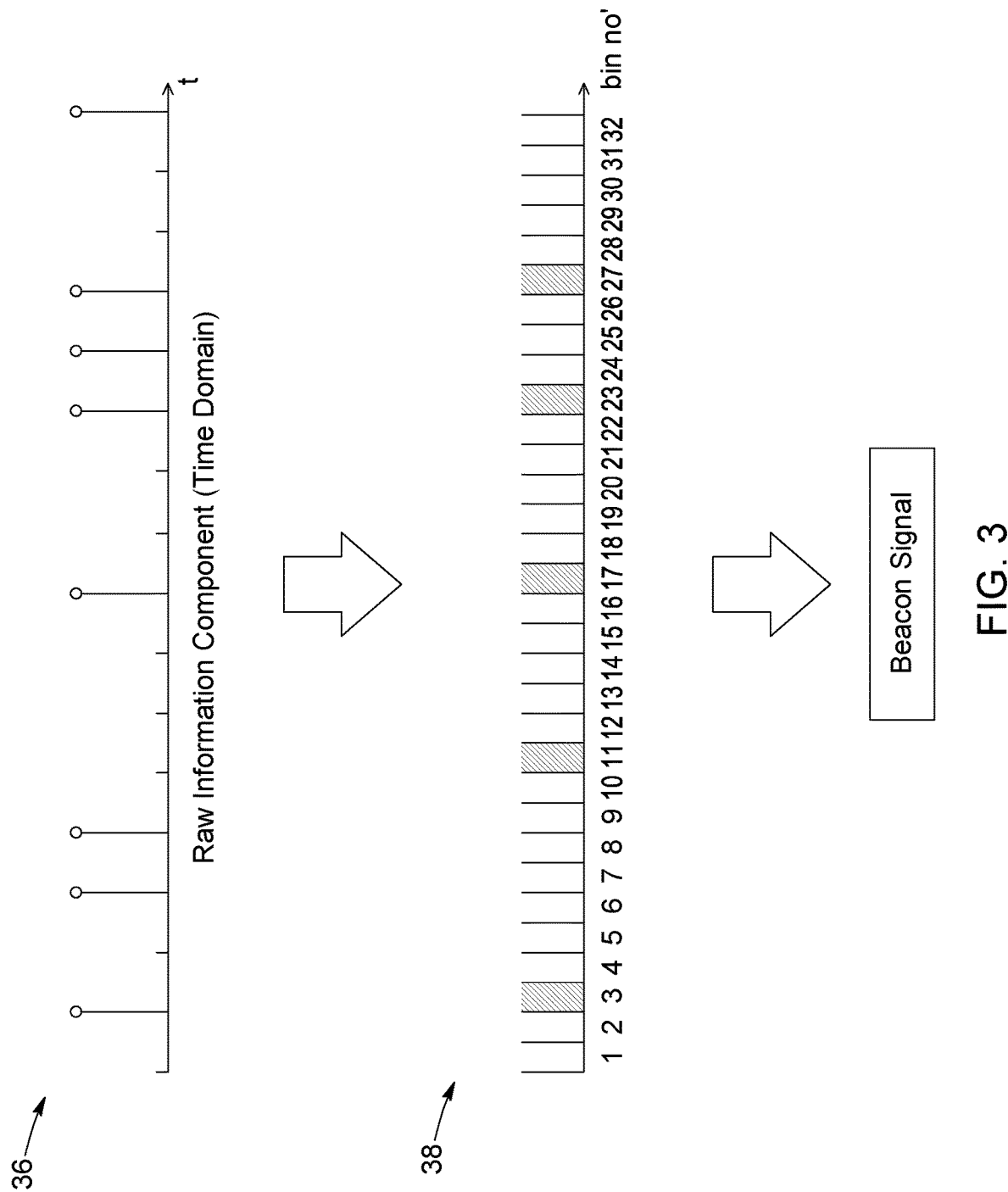
FIG. 3 illustrates representations of a portion of a raw information component and a portion of a frequency pattern according to one example embodiment.

Referring now to FIG. 3, therein illustrated are a representation of a portion of the raw information component 36 in the time domain and a representation of a portion of a frequency pattern 38 according to an example embodiment. The raw information component 36 is illustrated as a sequence of bits. In the illustrated example, 8 bits of the sequence are of a high value, while the remainder are of low values. The frequency pattern 38 shows a plurality of FFT bins. The shaded bins 39 represent bins that form part of the frequency pattern 38. It will be appreciated that only odd-number bins are selected in the illustrated example.

Figure 4:
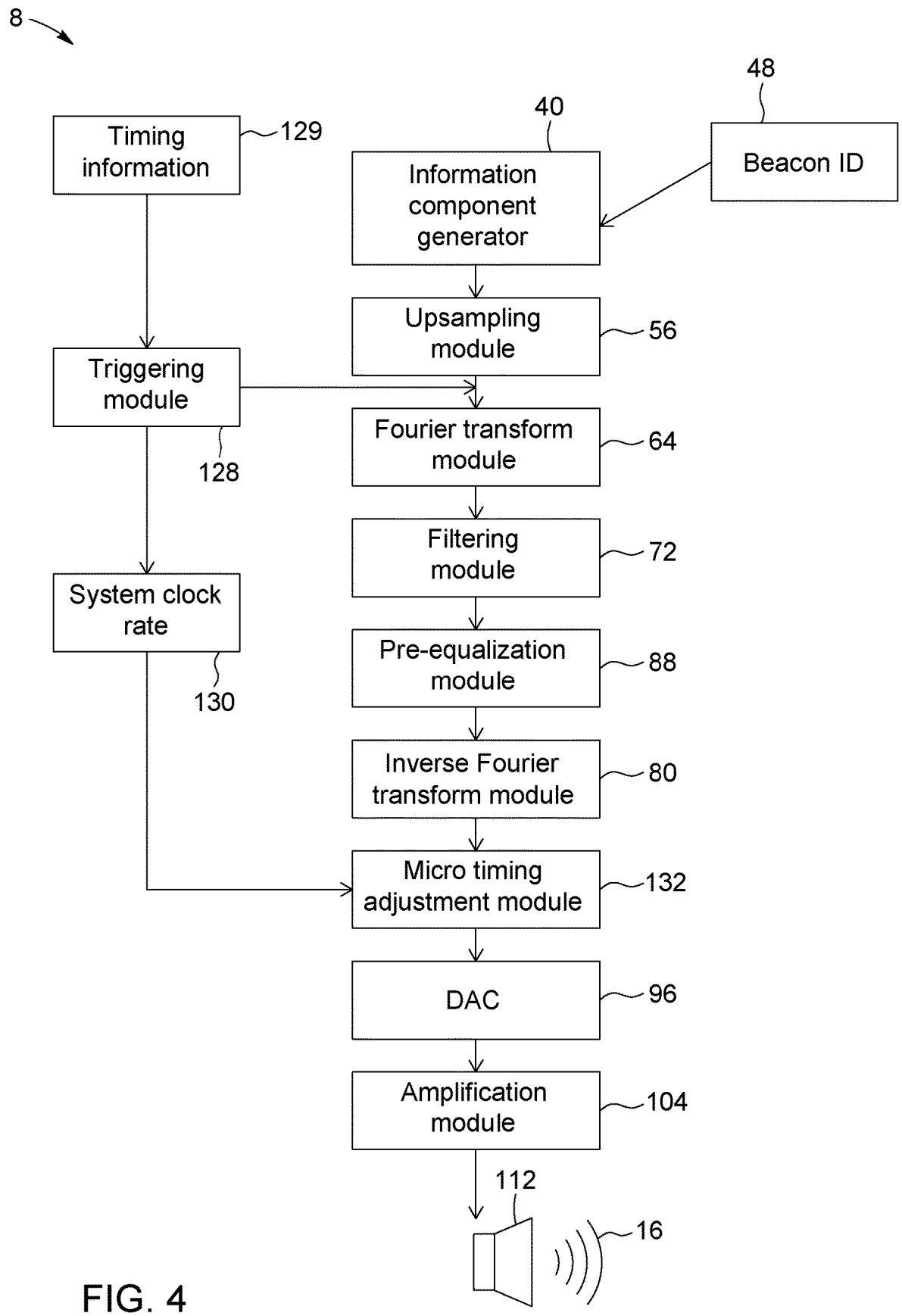
FIG. 4 illustrates a schematic diagram of the operational modules of a beacon device of the positioning-enabling system according to an example embodiment.

Referring now to FIG. 4, therein illustrated is a schematic diagram of the operational modules of a beacon device 8 according to an example embodiment. FIG. 4 also represents the operational steps carried out on the beacon side of a method for enabling the determination of the position of a receiver within the space.

The beacon device 8 includes a code generator 40 configured for generating the unique raw information component. The unique raw information component is associated to an identifier 48 for the beacon device 8. For example, a beacon device controller (not shown) may operate within a back-end to assign unique raw information component to each beacon device 8 of the positioning system 1. The beacon device controller further stores the association between an ID of a beacon device and the unique raw information component assigned to it. The beacon device controller may further store the location of each beacon device. The beacon device controller may be implemented in computer programs executing on programmable computers, such as a mainframe computer, server, or personal computer.

The beacon device 8 optionally includes an upsampling module 56 which upsamples the raw information component to generate a time-domain representation thereof. A step of upsampling the raw information component is carried out within the method for enabling the determination of the position of the receiver.

The beacon device 8 includes one or more modules for modifying the raw information component so that it is represented by the frequencies of the unique frequency pattern associated to the beacon device 8. According to the illustrated example embodiment, the beacon device 8 includes a FFT module 64 to obtain a frequency domain representation of the raw information component, a filtering module 72 for filtering the raw information component by the frequencies of the unique frequency pattern and an inverse FFT module 80 for performing an inverse FFT to the raw information component after having filtering applied thereto.

The beacon device 8 optionally includes a pre-equalization module 88 that is configured for adjusting the beacon signal to be transmitted. The module 88 may adjust the beacon signal to compensate for any deficiencies (ex: hardware deficiencies) within the beacon device 8, such as within the transducer 112. For example, the beacon signal may be adjusted to compensate deficiencies in the frequency response or frequency dependent phase shifts of the transducer. In the illustrated example the pre-equalization may be carried out in the frequency domain to adjust specific frequencies of the filtered raw information component.

Additionally, or alternatively, pre-distortion of the beacon signal may be performed. The pre-distortion may also be for compensating for deficiencies within the beacon device 8. The pre-distortion may be performed in the time domain and/or the frequency domain. Pre-distortion may also be performed at a plurality of instances during signal generation.

The beacon device 8 further includes a digital to analog convertor 96 that is configured for converting the modified raw information component from its representation in the digital domain to an electrical analog signal. The digital to analog convertor 96 may be an interface of a sound card. The digital to analog convertor 96 may be a low latency output 96 to further provide fine control over the timing of the output of the beacon signal 16. Preferably, timing may be controlled to the nearest sample.

The beacon device 8 further includes an amplification module 104 that is configured to amplify the analog signal outputted from the digital to analog converter 96.

The beacon device 8 further includes a transducer 112 which is driven by amplified signal outputted from the power amplifier 104. The beacon signal 16 being an acoustic frequency range signal and having the unique information component and the frequency pattern is outputted from the transducer 112 of the beacon device 8.

The beacon device 8 also includes one or modules for ensuring accurate timing when transmitting the beacon signal therefrom. Accurate timing is important because the determination of the position of the receiver is based on time delay information between transmission of the beacon signal from the beacon device and the receiving of the beacon signal at the receiver. The timing of the transmission may be based on a relative time reference (i.e. the timing of the transmission of the beacon signal in relation to transmissions of beacon signals from other beacon devices of the system) and/or based on a global time reference (i.e. a global clock shared by the beacon devices and the receiver).

The beacon device 8 receives timing information 120 from an external source, such as over the network 24 interconnecting the beacon devices 8 of the positioning system 1. The beacon device 8 also includes a triggering module 128 that is configured for triggering the processing of the raw information component so as to begin the generation of the beacon signal 16.

The beacon device 8 may also include a clock synchronizing module configured for reconciling the timing difference between a global time of the timing information 120 and the internal clock of the beacon device 8 (ex: the clock rate 130 of the sound card of the beacon device 8). In some situations, this difference is likely to be only a few clock cycles per second due to crystal clock differences. A repetition rate of the triggering module 128 averaged over many cycles may be used to deduce an accurate version of the global time.

The beacon device 8 may further include a micro-timing adjustment module 132 configured for synchronizing the outputting of instances of the beacon signal with the global time. In some embodiments, if the digital to analog converter 96 cannot output at exactly the global time, then down conversion may be performed, such as through decimation. Technically, if decimation is to be performed, then a low pass filter could be applied as an anti-alias filter before the data is decimated. This could be applied as part of the comb filter. It will be understood that such an implementation would require the comb filter part to know the final output rate. It may be preferable to output at the highest rate allowed by the sound output device, and allow the analogue parts of the system—the amplifier and speaker—to apply their own natural bandwidth limit to the data. In this manner, an anti-alias filter may not be required, which may be advantageous as such a filter may "steal" valuable bandwidth running up to the Nyquist frequency.

In an exemplary implementation of the system and method described herein, a receiver located within the positioning-enabling space receives signals in the acoustic frequency range. Once received, these signals are filtered by the frequencies of the unique frequency pattern associated to a beacon device of interest to generate a filtered signal. This has the effect of separating out frequency ranges that are not being used to carry the information component of the beacon signal of interest. The beacon device of interest refers to a given one of the beacon device of the working subset and from which the beacon signal transmitted therefrom is currently being used by the receiver to determine its position within the positioning-enabling space. Of course, the receiver may "test" a received beacon signal using the unique frequency patterns known to be associated with several beacons devices provided within the positioning-enabling space before finding a match to a given beacon of interest.

The receiver then determines time delay information that is indicative of the time delay between transmission of the beacon signal from the beacon device of interest and the receiving of the beacon signal at the receiver. For example, the receiver carries out a correlation (ex: rolling correlation) in time of the filtered signal with a version of the information component of the beacon signal. The version of the information component may be a replica of the raw information component used to generate the beacon signal at the beacon device of interest. As described elsewhere herein, the version of the information component may be a copy of the raw information component further filtered by the same unique frequency pattern applied by the beacon device when generating the beacon signal. This version of the information component may further be pre-distorted to take into account distortions present in the channel and on the receiver device. A correlation peak from the correlation is identified, which provides time delay information (time difference of arrival information) of the information component of the received beacon signal.

It will be understood that various types of correlation may be applied, such as circular correlation. It was observed that the circular correlation reduces the length of the processed FFT on the receiver-side, which reduces the amount of computing time required.

Figure 5:
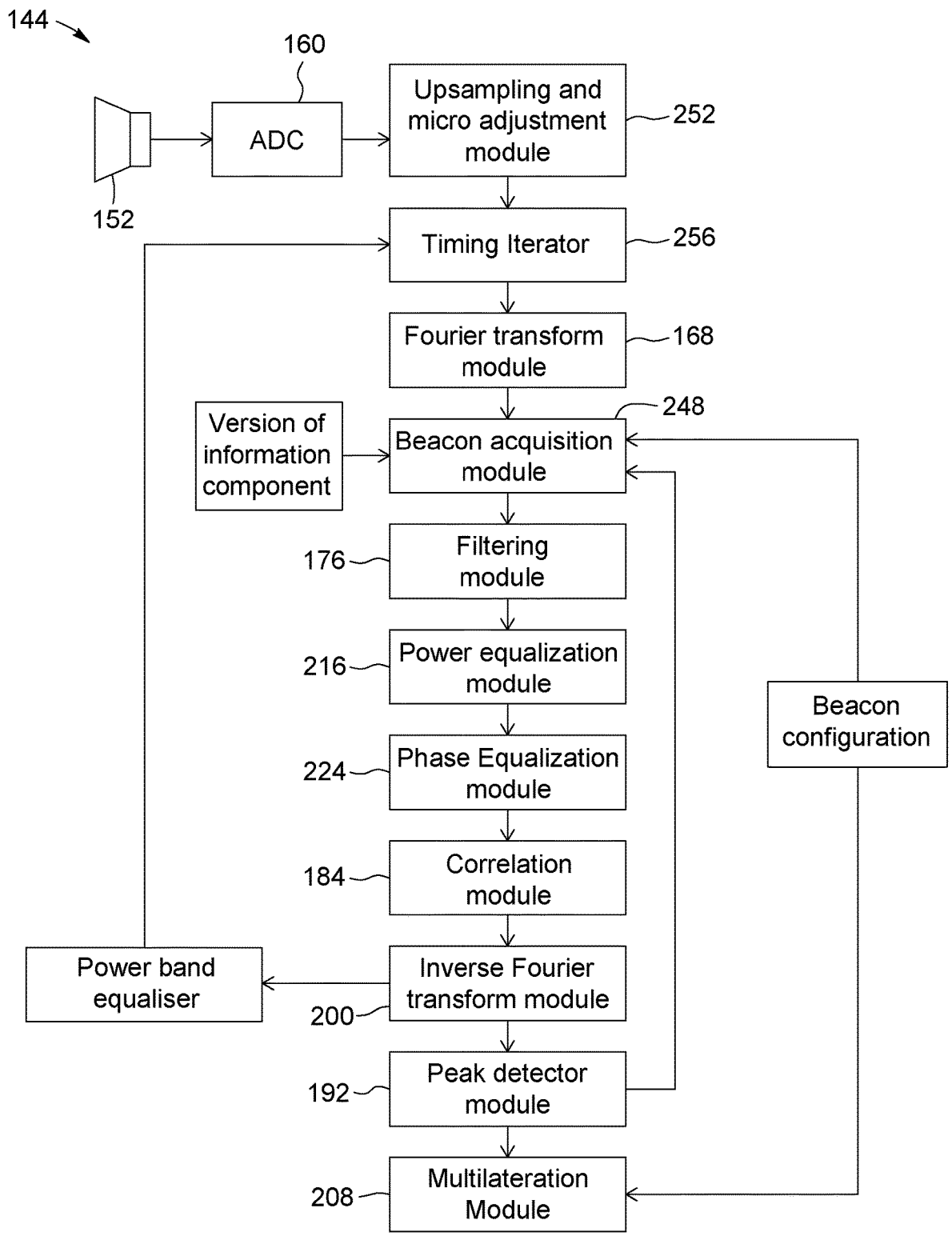
FIG. 5 illustrates a schematic diagram of the operational modules of a receiver device according to an example embodiment.

Referring now to FIG. 5, therein illustrated is a schematic diagram of the operational modules of a receiver device 144. FIG. 5 also represents the operational steps carried out on the receiver side of a method for determining the position of a receiver within the space.

The receiver device 144 includes a transducer 152 configured to receive signals in the acoustic frequency range and convert the received acoustic signals to analog electrical signals.

An analog to digital convertor 160 is configured to convert the analog electrical signals to a digital representation thereof. A Fourier transform module 168, which may be a FFT module, is configured to obtain frequency domain representation of the received signals. A filtering module 176 is configured for filtering the received signals by the frequencies of the unique frequency pattern associated to the beacon signal transmitted from a beacon device of interest. The signal outputted from the filtering module 176 should resemble the beacon signal transmitted from the beacon device of interest, but will be time-delayed, attenuated and distorted by acoustic signal from other sources (ex: portions of beacon signals that have frequency patterns that partially overlap with the frequency pattern of the beacon device of interest, ambient noise, and/or other acoustic noise sources in the position-enabled space).

A correlation module 184 carries out the correlation in time (ex: rolling correlation or circular correlation) of the filtered signal with versions of the information component of the beacon signal. As described elsewhere herein, the versions of the information component may be time-delayed replicas of the raw information component used to generate the beacon signal at the beacon device of interest. Alternatively, the versions of the information component may be copies of the raw information component further filtered by the unique frequency pattern for the given beacon devices, each version being time-delayed. The correlation may be performed for a plurality of time-delayed versions of the received beacon signal. The correlation is preferably carried out in the frequency domain to lower the computational load. The version of the information component may further be pre-distorted.

It was observed that while the beacon signal is only a partial reproduction of the raw information component, their correlation still exhibited a sufficiently strong peak (when sufficiently matched in time) to allow for identifying that the received beacon signal corresponds to the beacon signal that was transmitted from the beacon signal device of interest and to distinguish it from other beacon signals.

According to an example embodiment, and as illustrated in FIG. 5, the receiver device 144 includes an upsampling and micro-adjustment module 252 that is configured to generate the plurality of time-adjusted versions of the received beacon signal. A timing iterator 256 further feeds each of the generated time-adjusted versions of the received signal to the FFT module 168, filtering module 176, and correlation module 184 to generate the plurality of correlations from which the peak representing the instance of the beacon signal is detected.

The receiver device 144 further includes a peak detector module 192 that is configured to scan the outputs of the correlation module 184. The correlation in time of the filtered signal with time-delayed versions of the information component outputs one or more correlation waves exhibiting correlation peaks. The peak detector module 192 detects a peak of interest among the generated correlation peaks that is representative of an instance of the beacon signal being received at the receiver device 144 after traveling over a direct path. The time-delay information of the version of the information component generating this peak is determined as being the time-delay information for the received beacon signal and provides an indication of the amount of time elapsed between the transmission of the beacon signal from the beacon device of interest and its receiving at the receiving device 8 after traveling over the direct path.

It was observed that the peak of interest should be sufficiently high (i.e. have sufficient power) to indicate that it corresponds to the beacon signal transmitted from the beacon device of interest, but that the peak of interest does not always correspond to the most powerful peak. For example, another peak may occur later in time if it traveled over a longer indirect path (ex: the beacon signal echoed off of a wall). This later peak may also have higher power if the direct path was obstructed and lead to signal attenuation and the longer indirect path was unobstructed.

According to an embodiment, the earliest peak that has sufficient power is determined as the peak of interest to represent the version having traveled over the direct path. A peak is determined as having sufficient power if its power greater than the noise level by a predetermined threshold (ex: threshold value in dBs). Where instances of the information component are periodically repeated in time within the beacon signal, the determination of the peak of interest may also detect peaks caused by long running echoes and resonances from earlier instances.

In the illustrated example, the detection of the correlation peak representing the most accurate time-delayed version of the beacon signal is determined in the time domain. Accordingly, an inverse Fourier transform module 200 (ex: carrying out an inverse FFT) is provided to convert the outputs of the correlation in time to the time domain prior to detecting the peaks at the peak detector 192.

The receiver device 144 may include one or more modules for carrying out equalization of the received acoustic frequency signals. In the illustrated example, the receiver device 144 includes a power equalization module 216 for adjusting amplitude (ex: power) for one or more frequency ranges. The power equalization module 216 may be configured to adjust certain frequency ranges so that the received signal has a flat frequency response. Advantageously, the equalization module may be useful to correct frequency dependent effects that are introduced between the transmission of the beacon signal from the beacon device 8 of interest and introduced within the receiver device 8. Such effects may include external acoustic noise sources and effects introduced by the analog to digital converter 160, the transducer 112 (ex: speaker) of the beacon device, the transducer 152 (ex: microphone), the air channel of the positioning-enabling space 100 over which the beacon signal travels, and objects within the space 100 that may affect the signal (ex: room acoustic). Carrying out equalization to obtain a flat frequency response is desirable where the transmitted beacon signal was pre-equalized to also have a flat frequency response. It was observed that performing the equalization is effective at increasing the amplitude outputted when carrying out the correlation within the correlation module 184. Without being tied to a particular theory, performing the equalization may also limit the impact of narrowband acoustic noise sources (ex: voices, music in the positioning enabled space) in the positioning-enabling space 100. Whereas such narrowband acoustic noise sources would otherwise introduce a narrowband peak in the frequency response, the equalization causes such noises to be muted within the processed signal that is used for performing the rolling correlation at the correlation module 184.

Since all frequencies of the beacon signal are transmitted at equal amplitude, it is expected that the receiver should receive the signal also with equal amplitude across the frequencies. Any difference is due to distortions and attenuations in the transducers and transmission medium. This already demonstrates the power of equalization in as much as it stops high power single frequency noises from obstructing the signal almost entirely. Given that the profile of the expected received signal is known, it is possible to perform equalization to adjust the actual received signal according to the expected received signal.

In the illustrated example, the receiver device 144 may also include a phase equalization module 224 for correcting phase distortions. The phase equalization is performed to correct phase distortions introduced by various modules of the receiver device 144, such as those introduced by one or more of the transducer 152, analog-to-digital converter 160, anti-aliasing filters, etc. The amount of phase correction to be applied can be predetermined based on known measured characteristics of the components of the receiver device 144. Where different receiver devices 144 are used within a system, such as different types of user devices (ex: smartphone, tablet, custom handheld device), the phase equalizer (which may be implemented in software) is configured to adjust characteristics of that device.

When a signal passes through the channel—it undergoes phase and amplitude distortion (or shifting) which is frequency dependent. It is not random and is therefore repeatable. Thus, given exactly the same conditions, the phase and amplitude shifting will remain consistent. Given that knowledge, then it is possible to re-adjust the signal by reversing the phase and amplitude shift, so as to restore the original beacon signal.

At a different physical location, the phase and amplitude shifting will be different for a number of reasons.

Sound transmitted on the main axis of a loud speaker will have a different phase and angle shift than sound transmitted off the main axis. Some loudspeaker manufacturers publish this information as polar plots, but it can be measured for any speaker.

Sound received at the microphone of the smart phone will have different phase and amplitude shifts depending upon the angle of arrival of the sound from the beacon to the microphone.

Multi-path will create apparent phase and amplitude distortions of the main line of sight signal. In the radio world receivers attempt to be adaptive enough to completely undo the effect of multipath, and indeed add the extra signal power of the multi-path signal through equalization into the main line of sight signal.

According to one example embodiment, various operations/modules of the receiver devices 144 may be combined and/or carried out in parallel. For example, the filtering module 176, phase equalization module 224 and correlation module 184 may be performed in a single operation (ex: a single correlation step). Furthermore, the time-delayed versions of the information component generated at the receiver device for use within the correlation may be pre-distorted and/or pre-convolved. This pre-distortion and/or pre-convolution can be applied to correct phase distortions, which may eliminate or decrease the need to apply phase equalization to the received beacon signal.

The amplitude and phase shifts may be grouped into two groups:

Static Equalization:

The static part of the system involves the main electronics of the system, as well as the non-dynamic constituents of microphones and loudspeakers. The properties of these components can be measured in a calibration or configuration stage, such as by the running average of each equalization analysis. The smartphone app could be pre-loaded with a static equalization which is a good approximation for the beacons and the microphone on board a particular phone. Once running, then this static equalization can be further refined and tuned as and when signals are resolved and the smartphone learns the particular acoustics of the environment. It is expected that this static equalization will provide an improvement over running without any equalization.

Dynamic Equalization:

The dynamic part of the system involves the additional phase and amplitude shifts that change because of location, and that cannot be included as part of a static equalization. As discussed these are due to differences in angle of transmission from speakers and angles of arrival at the microphone, in addition to multi-path:

For angle of transmission from the beacon, it would be possible to use approximate location to access look up tables for a particular beacon to determine the appropriate dynamic equalization. It also should be possible, as long as an initial signal has been located, to further tune the equalization to retrieve the best possible signal.

For angle of arrival at the microphone, inertial sensors of a mobile device may be used to provide device orientation, and then knowledge of where signals should be coming from would allow for this type of dynamic equalization. Further dynamic tuning can also be implemented.

The MLS sequence has the unique property that when auto-correlated with itself yields a correlation spike that is in fact the impulse response of the system. In ideal conditions, the correlation spikes are single sided and only 1 sample wide. In practice, the spikes oscillate on both sides of the 'y' axis and are several samples wide. This indicates the signal is passing through a real 'channel', and that it is being distorted in both phase and amplitude. The FFT of this impulse response (already calculated) yields the frequency dependent phase and amplitude of the response for every frequency in the FFT bin. This raw data, can be used to perform the static and dynamic equalization as discussed above.

Various modules of the receiver device 144 have been described herein with respect to a single beacon signal received from one beacon device of interest. It will be understood that steps carried out by these modules are repeated for beacon signals from a plurality of beacon devices so that the time delay information for a plurality of beacon signals of interest can be determined.

The time delay information determined for each beacon signal received from the beacon devices of the working subset is processed at multilateration module 208. This module 208 is configured to determine a position of the receiver device 8 based on the time delay information. For a beacon signal from a given beacon device, a pseudo range of the receiver relative to the beacon device can be determined from the time delay information. The position of the receive device 8 may be defined relative to each known location of the beacon devices of the working subset. For example, locations of the beacon devices defining the positioning-enabling space may be pre-stored within receiver device 8. The determination of the position can apply time difference of arrival multilateration methods known in the art.

Timing information of the transmission of the information components of the beacon signals transmitted from the differently located devices may be known and/or stored at the receiver prior to receiving the beacon signals. For example, the transmission of each instance of the beacon signals from the beacon devices of the working subset may be synchronized (ex: instances are transmitted at each full second, each ⅓ second and each ⅔ second of the beacon clock second). Accordingly, the receiver is configured to determine time delay information based on this synchronization scheme (which indirectly stores the timing information of the transmissions at the receiver). Where beacon signals are not synchronized, the receiver can store, or be configured according to, the timing information of the transmission of instances of the information component for each beacon device individually. It will be appreciated that time stamps for the transmission of each instance of the information component is not necessary.

Clock drift of the receiver relative to each beacon device (where beacons are not synchronized) or relative to the synchronized beacon devices can also be stored and/or determined at the receiver.

Where the receiver device 144 is synchronized in time with the beacon devices of the working subset, the position of the receiver device 144 may be determined from the time-delay information and location information of a working subset of three beacon devices.

Where the receiver device 144 is not synchronized in time with the beacon devices of the working subset, the position of the receiver device 144 may be determined from the time-delay information and location information of a working subset of four beacon devices.

The receiver device 144 may further include an application programming interface (API) for outputting the determined position of the receiver device 144. For example, the currently determined position of the receiver can be represented graphically on a display device, which may be a display device of the receiver device 144, within a graphical representation (ex: map) of the positioning-enable space 100. This may allow a user to quickly identify their location within the space.

Referring back to FIG. 2, the positioning-enabling space 32 is an indoor retail space and FIG. 2 includes a graphical representation of the retail space showing elements thereof (section of retail items and aisles of retail items). An icon 240 is displayed within the graphical representation to indicate a current position of the receiver device 144 within the positioning-enabling retail space 32. The receiver device may be the user's own device, such as the user's smartphone or tablet having an app. The app accesses information pertaining to the retail space 32 (ex: map) and information about beacon devices located in the space 32 (ex: beacon locations, beacon identifiers, raw information components associated to the beacon devices, and beacon signal timing information). This information may be stored locally on the user device or may be accessible over a network. Alternatively, the receiver device may be a device provided by the retailer operating the retail space. In some examples, the receiver device may be a custom device, such as incorporating a transducer for receiving beacon signals having an operating frequency range outside of the acoustic frequency range.

In deployment, a plurality of beacon devices 8 are distributed at different locations to cover the positioning-enabling space. Each beacon device 8 transmits its beacon signal in which the information component is repeated in time. The repeating of the information component enables substantially continuous determination of positioning in time. A given device receives a first set of instances of the information components in beacon signals from its working subset of beacon devices to determine its position within the space 32 at a first point in time. Later instances of the information components are further used to update the position of the receiver device 144.

In one example embodiment, the raw information component used to generate each beacon signal is a 14-bit polynomial MLS code, which allows for $2^{14}-1$ codes (i.e. 16383 unique numbers and binary sequences of 16383 zeros and ones, which may provide about 700 useful codes). Each bit of this sequence is transmitted as one bit of a 48 kSPS signal from the beacon. It takes approximately ⅓ of second to transmit each instance of the MLS code, thereby allowing up to 3 determinations per second of the position of the receiver device 144. Each instance of the transmission of the information component within the beacon signals from the beacon devices can be synchronized in time.

It was observed that this length of MLS code was useful because the ⅓ second time length between repetitions was sufficiently long to allow echoes to attenuate sufficiently, thereby allowing reliable use of the peak corresponding to the signal traveling over the direct path for determining position. Furthermore, the length of the MLS code allows for a theoretical coding gain of 84 dB. In practice, it was observed that 20 to 30 dB gain could be obtained.

As described elsewhere herein, a receiver device 144 determines its current position based on the time-delay information of the beacon signals from its working subset of beacon devices. As the receiver device 144 is displaced within the space 32, the working subset of beacon devices can be modified. Referring back to FIG. 5, the receiver device 144 can include a beacon acquisition module 248 that is configured to scan within the received signals in the acoustic frequency range for one or more beacon signals transmitted from beacon devices that are not currently a member of the working subset of beacon devices for the receiver device 144. For a given beacon device that is outside the working subset and whose beacon signal received at the receiver device 144 has a higher quality (ex: consistently stronger signal) than one of the beacon device of the working subset, that beacon device of the working subset is replaced by the given beacon device having the higher quality signal.

In one example embodiment, the receiver device 144 is configured to track a neighbor subset of beacon devices, which are beacon devices that are in proximity of the beacon devices of the working subset. Beacon signals are intermittently received from the beacon devices of the neighbor subset and analyzed to determine if one of these signals has higher quality than the signal received from one of the beacon devices of the working subset. The beacon signals from the neighbor subset may be analyzed less frequently than use of beacon signals from the working subset for determining current position of the receiver.

It was observed that determining the positioning of a receiver within an indoor environment causes extreme "near/far" effects in which a signal from a nearby beacon is much stronger than a second signal from a faraway beacon such that the second signal is drowned out by the first signal from the nearby beacon. In an indoor positioning system, some beacons may be within 1 metre of a receiver while other beacons may be up to 20 metres away. It was observed that relying on schemes using only an information component (i.e. without a component formed of a unique frequency pattern), the cross-correlation peaks between the first signal and the second signal can be greater than the correlation of the second beacon signal with the versions of its information component, which prevents effective detection of the peak of interest for the second beacon signal.

It was also observed that the "near/far" effect can also be caused by speaker directivity, whereby being located within a zone where energy radiated from a speaker is high creates a "near" source and being located within a zone where energy radiated from the speaker is low creates a "far" source.

Furthermore, it was observed that correlation peaks are decreased due to distortion introduced into the channel (ex: beacon transducer 112, receiver transducer 152 and air gap).

It was further observed that using a unique frequency pattern whereby a given beacon signal only reproduces its information component in the frequencies of its frequency pattern provides separation between different beacon signals at the receiver device 144. This separation is effective at overcoming the "near/far" problems.

Figure 6:
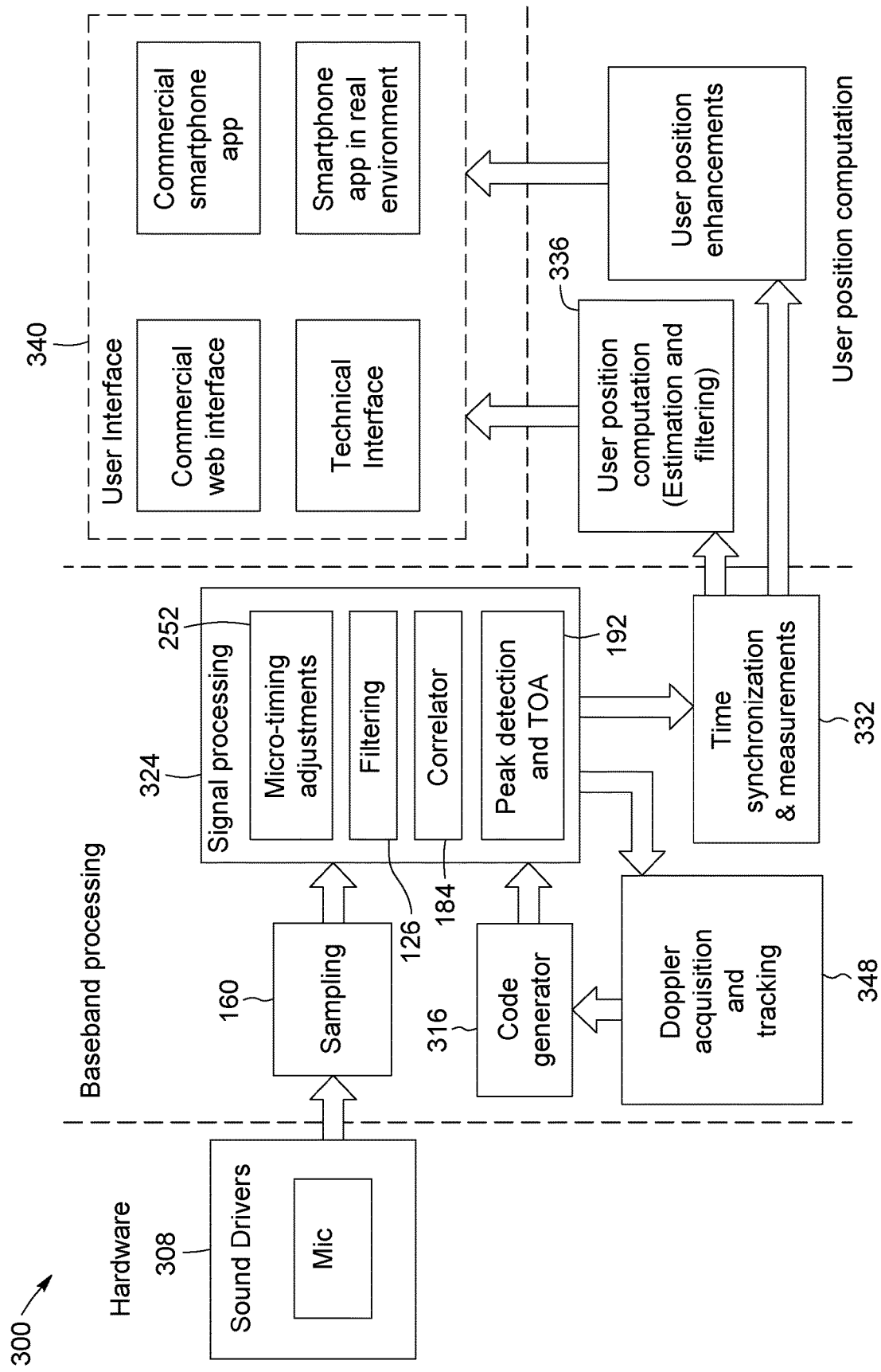
FIG. 6 illustrates a schematic diagram of a compensating receiver device according to an example embodiment.

Referring now to FIG. 6, therein illustrated is a schematic diagram of a compensating receiver device 300 according to one example embodiment. The compensating receiver device 300 is adapted to compensate for various factors that can affect the quality of the beacon signals received and processed at the receiver device 300. It will be understood that while a plurality of compensating modules are illustrated, some embodiments of the receiver device 300 may only include one or some of these modules.

The receiver device 300 includes a signal receiving stage 308, which may include the transducer 152.

The receiver device 300 includes a sampling stage 160, which may be the ADC 160 as described elsewhere herein.

The receiver device 300 further includes a code generator 316 that is operable to generate a version of the information component for the beacon signal to be used for the correlation described elsewhere herein.

The receiver device 300 includes a signal processing stage 324, which may include the micro-adjustment module 252, Fourier transform module 168, filtering module 176, correlation module 184, inverse Fourier Transform module 200 and peak detector module 192.

The results of the correlation are fed from the correlator 324 to the time synchronization module 332 for determining the offset in time between a received signal and the time at the beacon signal that transmitted the signal (i.e the time-delay information).

The user position computation module 336, which includes the multilateration module 208, estimates the position of the receiver within the space relative to the locations of the beacon device. A least-square method may be used within the determination of the position.

A user interface 340 allows a user of the receiver device to perceive the results of the determining of the position of the receiver.

Figure 7A:
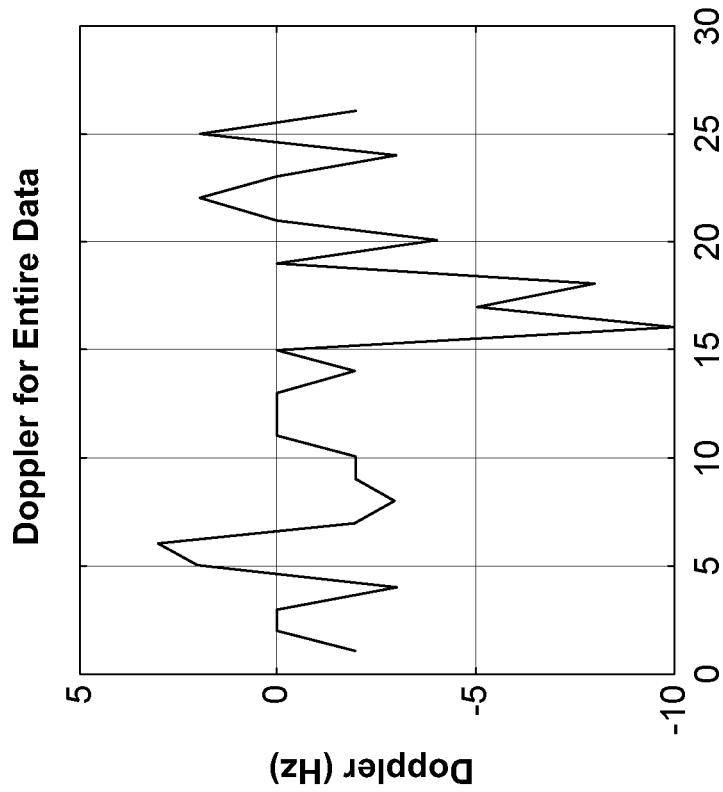
FIG. 7 illustrates two graphs of two received signals that have been frequency shifted due to Doppler effects.
Figure 7B:
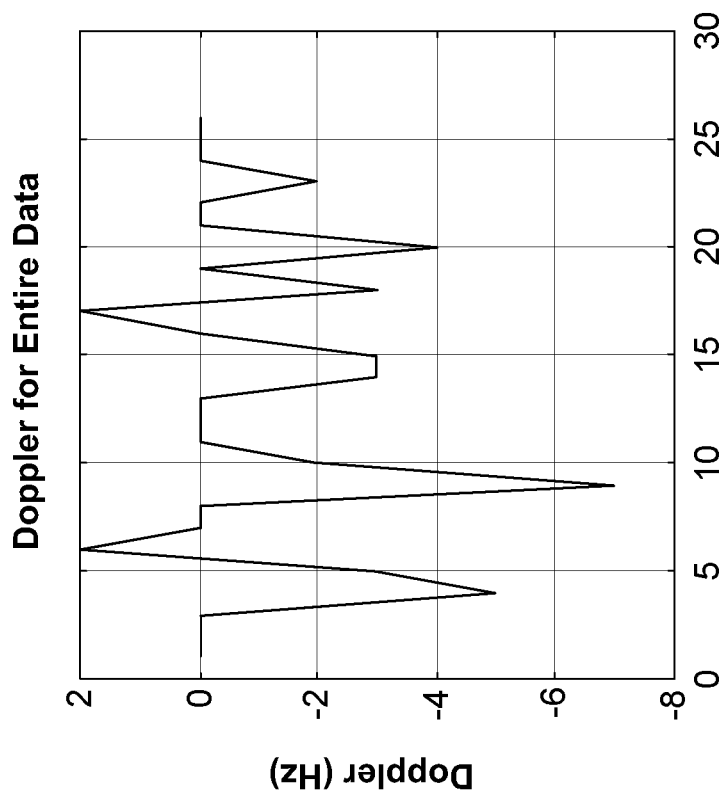

Continuing with FIG. 6, the receiver device 300 further includes a Doppler compensation module 348, which represents a first compensation module. The Doppler compensation module 348 compensates for Doppler effects caused by movement of the receiver, which causes shifts in frequency of a received signal. FIG. 7 illustrates two graphs of two received signals that have been frequency-shifted due to Doppler effects.

According to one exemplary method, a rolling correlation in frequency of a received beacon signal with a frequency delayed version of the beacon signal is carried out. FIG. 8 illustrates carrying out the rolling correlation in the frequency domain. The point in frequency that generated a peak is identified. This point in frequency represents a Doppler measurement for the received signal and indicates the amount of the frequency shift caused by the Doppler effect.

The Doppler measurement may be used to shift the frequency pattern applied for filtering the received acoustic frequency signal.

The rolling correlation in frequency is effective for obtaining a Doppler measurement in an acquisition or initialization stage. At this stage, Doppler information for any of the received beacon signals have not yet been determined. The rolling correlation in the frequency domain may be carried out in parallel with a rolling correlation in the time domain.

According to an example embodiment, subsequent to determining the initial Doppler measurement, the Doppler measurement may be updated for subsequently received signals from the beacon devices.

The updating may be used by limiting the determination of the Doppler measurement to a narrower frequency range. This narrower range may be determined based on the current Doppler measurement. This may include narrowing the range of the rolling correlation in the frequency domain based on the currently determined Doppler measurement.

The updating of the Doppler measurement can also be improved by tracking changes in the Doppler measurement based on changes in the determined position of the receiver across a plurality of received signals from the beacon device. The motion of the receiver relative to the beacon device can be tracked in time and fed back for updating the Doppler measurement and provides an indication of expected frequency shifts.

The updating of the Doppler measurement can also be improved by tracking changes in the Doppler measurement based on frequency shifts in the information component of the received signals. One or more tracking loops may be used to track the received signals.

According to one example embodiment, a phase lock loop may be used to track the received signals. Furthermore, a delay lock loop may be applied to track the frequency shifts in the information component (such as the MLS code). It was observed that the movement of a user holding the receiver (typically a pedestrian) is complex in nature. Accordingly, a higher order delay lock loop and phase lock loop is applied to suitably track this type of movement. The order and the bandwidth of the tracking lock loops may be adjusted adaptively.

In some example embodiments, the tracking loops may be based on a Kalman filter to determine the incoming Doppler effect on a continuous basis. After acquisition or initialization as described above, the tracking loops are applied and smoothing using the Kalman filter. The use of the Kalman filter can also narrow the frequency range that is analyzed for determining the incoming Doppler effect, which can further reduce the computation load from performing correlation in time.

In addition to narrowing the frequency range that is analyzed for determining the incoming Doppler effect, the tracking of the Doppler may be further improved using a customized Constant False Alarm Rate (CFAR) based detection scheme. The receiver devices repeatedly tracks the received information component and determines the received information component using CFAR detection. The detected Doppler effect is fed to the tracking loops, which then determines the frequency shift on the information component and determines the corrected Doppler effect. It was observed that since the pedestrian (ex: human user) motion is complex in nature, the CFAR keeps an improved number of guard cells to determine the incoming Doppler effect and the tracking loops employ a higher order of code lock loop to follow the pedestrian dynamics. Furthermore, based on the pedestrian motion pattern and the accuracy requirements, the order and the bandwidth of the tracking loops may be varied adaptively.

The CFAR may also be applied for tracking the correlation in time between the received beacon signal and the version of the information component for that beacon signal.

It was observed that the time delay information between the transmission of the beacon signal from the beacon device of interest and the receiving of the beacon signal at the receiver includes a receiver clock bias. This is the difference between the clock of the receiver and the clock of the beacon device transmitting the beacon signal.

Where a receiver receives beacon signal from four or more beacons, the clock bias is computed using multilateraltion. That is, when a receiver has measurements from four beacons, a user can compute four unknowns: x, y and x coordinates and user clock bias. If the number of measurements is less than four, the estimation process (for example Least-squares) is rank deficit and cannot compute output states. Thus, the user can compute all three coordinates and user clock bias only if four or more observations are available.

Figure 9:
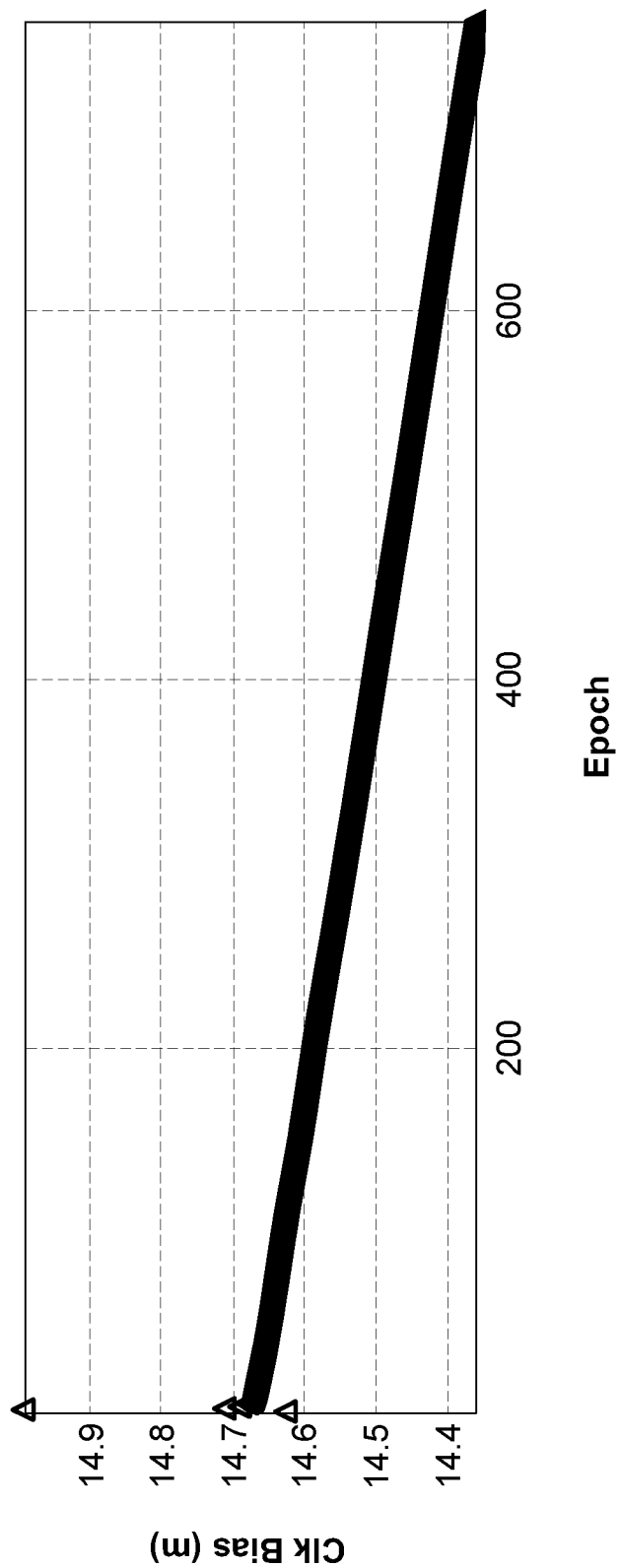
FIG. 9 illustrates an example of change in clock bias due to clock shift over time.

In addition to the receiver clock bias, the beacon clock and the receiver clock exhibit clock drifts, causing the receiver clock bias to be changed over time. FIG. 9 illustrates an example of change in clock bias due to clock drift over time. It was observed that the clock drift does not substantially affect the determination of the position of the receiver in consecutive instances of the beacon signal (each sequential receiving of the beacon signal from a beacon). However, the correlation in time of the information component of beacon signal with a received acoustic signal may be affected by the clock drift. That is, as the clock drift becomes larger, the gain from the correlation decreases and the accuracy of the time-delay and the positioning determination is also affected. Thereby, decreasing overall performance.

According to one example embodiment, an amount of clock drift may be determined. This amount of clock drift can further be used to address the rolling correlation in time of the filtered received signal. It will be appreciated that this adjustment ensures a high gain (ex: in dBs) in the correlation. It was observed that a gain of 3 dB is achieved when the clock drift is compensated for a half chip length of the MLS code.

The clock drift of the receiver can be determined for each beacon device. More particularly, where transmissions of instances of information component within the beacon signals from the working set of beacon devices are synchronized, the clock drift calculated for the receiver is applicable to the entire working set, and therefore also for each beacon device of the working set. Where the beacon devices are not synchronized, a clock drift of the receiver must be determined relative to each beacon device individually.

The clock drift may be initially determined using a sledge hammer approach, whereby versions of the information component adjusted for clock drift are correlated in a rolling correlation in time with a received filtered signal to find the adjustment that provides the highest correlation. This provides an initial determination of the clock drift.

The initial clock drift may be further updated for each instance of the beacon signal based on a known rate of change of the clock bias. This updated clock drift may be applied in the rolling correlation time of the filtered signal for determining the time delay between the transmission of the beacon signal from the beacon device and the receiving of the signal at the receiver. It was observed that this way of updating the clock drift provides a useful, but coarse value.

The clock drift is applied to the locally generated code to avoid loss of correlation gain. Determining the position of the receiver along with clock bias can help to compute coarse value of clock drift. If Doppler measurements are used in position determination, precise values of clock drift can be obtained According to one example embodiment, the determination of the clock drift uses the Doppler measurement that is obtained as described elsewhere herein. It was observed that the Doppler measurements are smoother and provided for a more precise determination of the clock drift.

Furthermore, the determination may further apply a Kalman Filter to smooth out the determination of the clock drift. The Kalman filter estimates the clock drift by adaptively weighting the receiver position and the raw measurements.

The Doppler measurements are used in position estimation, for example Least-squares, to determine the clock drift. The Doppler measurements provide range rate information from each beacon and this helps to determine clock drift of the receiver dock.

The analogy goes as: Pseudorange measurements are used to determined clock bias and Doppler measurements are used to determine clock drift in the estimation process.

In an indoor environment, acoustic signals are susceptible to bouncing off of the floor, walls and ceilings over an indirect path. As described elsewhere, the earliest peak having sufficient power is determined as the peak of interest to represent the version having traveled over the direct path. Various additional aspects may be used to enhance determination of the peak corresponding to the signal that traveled over a direct path.

In one technique, the MLS code sequence are chosen so that its auto-correlation does not generate any secondary peaks. The length of the MLS code sequence can also be chosen so that peaks corresponding to a signal over an indirect path is located remotely in time from a primary peak. Furthermore, the spreading of the beacon signals over a large acoustic frequency range decreases cross-correlation amongst signals from multiple beacon devices.

Continuing with FIG. 6, the correlation module 324 may further include a multi-path compensation module 356 that applies ray tracing. Ray tracing refers to determining an expected direct path of a beacon signal between the beacon device and the current position of the receiver. Accordingly, the expected time of arrival (i.e. the time of the primary peak corresponding to the direct path) may be estimated from the ray tracing. From the correlation, a peak occurring nearer in time to the expected time of arrival may be determined as the primary peak. Similarly, ray tracing may be applied to determine the expected time of arrival of a signal over an indirect path (based on known geometry of the space in which indoor positioning is being performed). From the correlation, a peak occurring nearer in time to the expected time of arrival over the indirect path may be isolated as a secondary peak and determined to not correspond to a primary peak, thereby mitigating multi-path errors.

The multilateration can be applied from the primary peak determined for the beacon signal received from each beacon device of the working set. That is, for each beacon device, the primary peak is used to determine the time-delay information, which is further used to determine the pseudorange to be used for multilateration.

As described elsewhere herein, at least one additional condition may be sensed by another sensor of the device. This sensed condition may be used for compensating the determination of the position of the receiver.

For example, the accelerometer of the receiver device provides dynamics of the user using the receiver and help define the search range of the Doppler effects when performing the rolling correlation in frequency.

For example, accelerometers in combination with measurements from a gyroscope, barometer (useful to determine rate of change of the height of the receiver) and magnetometer provide receiver motion information and are integrated into receiver position estimation using Kalman Filter. The Kalman filter is effective for determining the receiver position even when the number of beacon devices present is less than four. This may be useful where some beacon signals may be attenuated due to obstacles, such as the body of the user.

While various examples described herein pertain to a receiver being a user device (ex: handheld device) being used to determine a current location of the user within the positioning enabled-space, it will be understood that the receiver can be a device other than a user device. In some example embodiments, the receiver can also include a transmitter module for transmitting data providing a current condition of the receiver or an item associated to the receiver. An item is associated to the receiver in that a determined current location of the receiver within the positioning-enabled space is also indicative of the current location of that associated item within the space. The data providing current condition of the receiver/item may be acted upon.

For example, the current condition may be the current location of the receiver/item within the positioning-enabled space. The current condition may also include a condition that is not related to the current location.

For example, the item can be a device (ex: autonomous robot) that is displaced autonomously within the position-enabled space 32 and is operable to sense one or more conditions in its vicinity. It may transmit an alert and its current location when a critical condition is sensed (ex: spill in an aisle), so that the location of the critical condition is known can be acted upon.

The item may be a non-autonomous item. In one example, the item may be often displaced (ex: a tool used by many users). By transmitting its current location as its current condition, the item can be easily located by a user within the positioning-enabled space.

In another example, the item is substantially stationary but knowledge of its current location and another condition can be useful. The item may be a piece of equipment requiring intermittent maintenance. The maintenance state of the item and its current location can be transmitted so that an operator can quickly move to that location and service the piece of equipment.

In the retail space, one or more goods may have limited shelf life (ex: perishable foods). The item may be a location-enabled timer which triggers an alert and its current location when the shelf life has expired, so that the goods can be replaced.

It will be appreciated that for networked items (ex: Internet of things items operable to transmit a condition about itself), being able to determine a current location of those items according to methods and systems described herein provide an additional layer of intelligence to these items.

Various example embodiments described herein enable determining the current location of the receiver using only the received beacon signals. However, in other example embodiments, the current location of the receiver within the positioning-enabled space may be determined based on the received beacon signals in combination within at least one additional sensed condition. The at least one additional sensed condition may be used to validate, enhance and/or temporarily replace the current location determined based on the received beacon signals. For example, where the receiver is a portable user device, such as a smartphone, tablet, laptop or portable video game device, the at least one additional condition may be sensed by another sensor of the device, such as Wi-Fi strength, Bluetooth strength, NFC, RFID, gyroscope, compass, accelerometer, barometer, and/or ambient light detector, etc. For example, the current location determined from the received beacon signals can be enhanced by a known current orientation of the user device, a speed of travel of the user device, and/or both. This information may be used to mitigate near/far effects, correct determined location for the user device currently being displaced, or temporarily extrapolate the current location when the user device.

The additional sensed condition may be received as raw sensor data from a sensor of the user device. Alternative, the user device can include one or more installed software modules that provide a preprocessing of the raw sensor data and output synthesized data indicating one or more current conditions of the device, which is used as the one or more additional sensed conditions for supplementing, enhancing, or replacing the current location determined from the received beacon signals.

Figure 10:
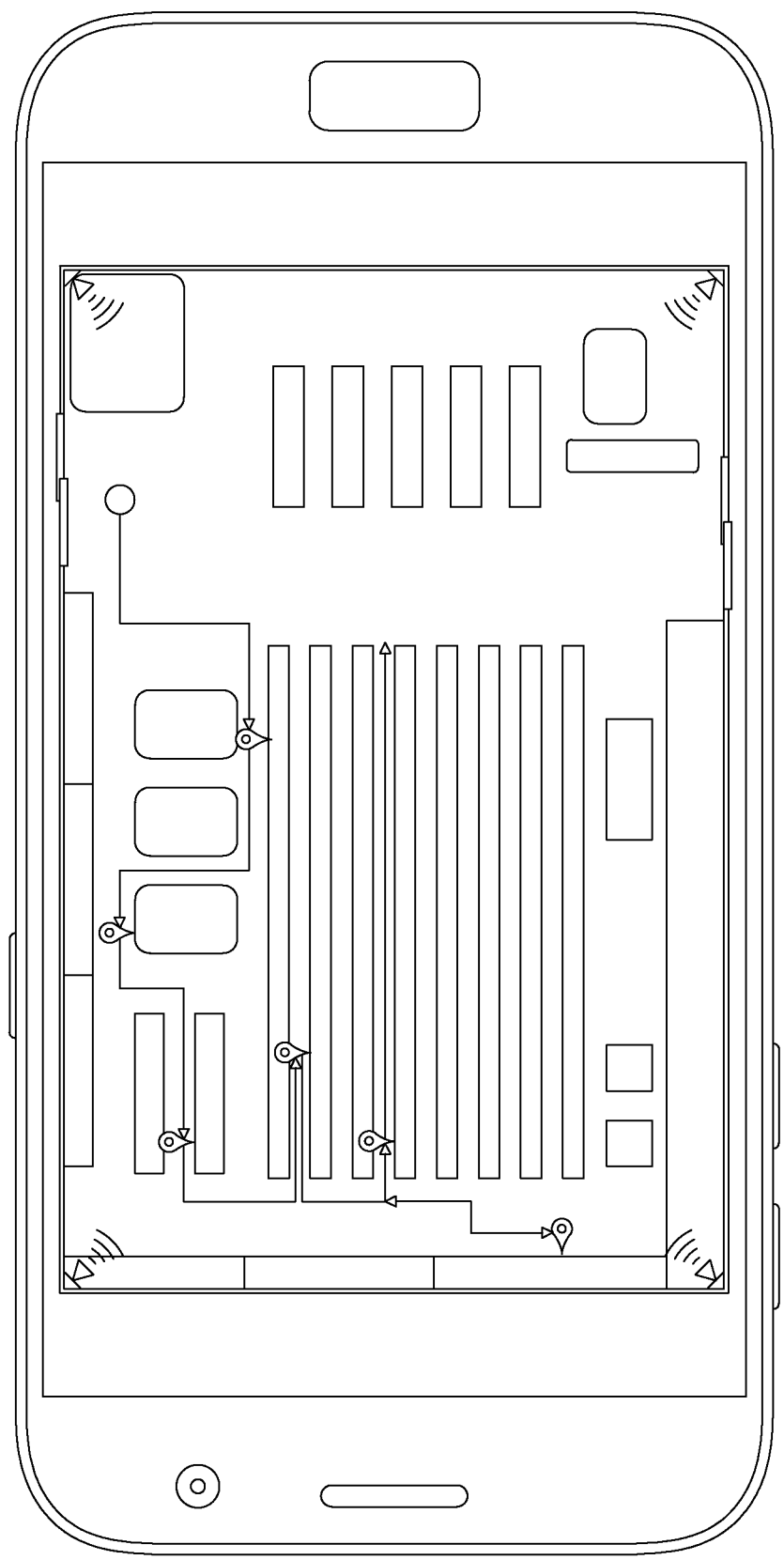
FIG. 10 illustrates a user interface on a user device, which may be used as a receiver device, showing the positioning-enabled space.

FIG. 10 illustrates a user interface according to an example embodiment on a user device, which may be used as a receiver device, showing the positioning-enabled space.

As provided elsewhere herein, although various example embodiments are provided herein with respect to a retail space or warehouse, it will be understood that the positioning system and method described herein may also be applicable for other applications where knowing's one's current location is beneficial. For example, the positioning system and method can be applied to infrastructure areas (ex: airports, train station, bus stations, stadiums, shopping centres, other public spaces) where knowing one's location with respect to one or more points of interest (ex: airport gate, bus stop, numbered seat, store/kiosk) can help a user navigate to that point of interest. Such applications may have low accuracy requirements than retail or inventory applications.

It was observed that implementations of the systems and methods described herein using acoustic frequency beacon signals can determine location of a receiver within the space to an accuracy of less than 10 cm. This accuracy is achievable even when determining a position in 3 dimensions. Furthermore, this accuracy may be maintained whether the receiver is static or is in movement (by determining Doppler effect on an ongoing basis).

It was further observed that the determination of the location is robust and efficient in performance. Three types of receiver location can be determined, even simultaneously:
- a two-dimensional position with three or more received beacon signals;
- a three-dimensional position with four or more received beacon signals; and
- a weighted filtered receiver location that combines the accuracy of an instantaneously determined location with information from previously determined locations.
- The final receiver location is determined based on the integrity of each type of location and can deliver a robust and accurate location determination.

Several alternative embodiments and examples have been described and illustrated herein. The embodiments of the invention described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. It is understood that the invention may be embodied in other specific forms without departing from the central characteristics thereof. The present examples and embodiments, therefore, are to be considered in all respects as illustrative and not restrictive, and the invention is not to be limited to the details given herein. Accordingly, while specific embodiments have been illustrated and described, numerous modifications come to mind without significantly departing from the scope of the invention as defined in the appended claims.

The invention claimed is:

1. A method for enabling the determination of a position of a receiver within a space, the method comprising:
providing a plurality of beacon devices at different locations within said space; and
transmitting a beacon signal from each of the beacon devices, each beacon signal having a unique information component and a unique frequency pattern of multiple frequencies, each beacon signal being distinguishable from the beacon signals transmitted from any other of the beacon devices based on a combination of its unique information component and its unique frequency pattern;
wherein each beacon signal is generated by filtering a raw information component by the frequencies of the unique frequency pattern of the beacon signal;
wherein the transmitting of the information component within each beacon signals transmitted from the beacon devices are synchronized in time; and
wherein the information component is repeated periodically within each beacon signal.

2. The method of claim 1, wherein the unique frequency pattern of multiple frequencies is in the acoustic frequency range.

3. The method of claim 1, wherein the information component of each beacon signal is generated from a maximum length sequence code.

4. The method of claim 1, wherein no frequency of the unique frequency pattern is an even harmonic of any other frequency of the unique frequency pattern.

5. The method of claim 1, wherein the raw information component is upsampled and the filtering is applied to the upsampled information component; and
wherein the filtering comprises:

applying a Fourier transform to the upsampled information component;
applying a comb filter having the frequencies of the frequency pattern to the transformed information component; and
applying an inverse Fourier transform to the filtered transformed information component.

6. The method of claim 1, further comprising:
receiving acoustic frequency signals at the receiver;
for each beacon signal transmitted from a working subset of at least three of the plurality of differently located beacon devices:
filtering the received acoustic frequency signals by the frequencies of the frequency pattern for the beacon signal to generate a filtered signal;
carrying out a correlation in time of the filtered signal with a version of the information component of the beacon signal;
identifying a correlation peak from the correlation, the correlation peak providing time-delay information of the beacon signal; and
applying multilateration to determine a position of the receiver based on the location of each beacon device of the working subset of beacon devices and the time-delay information of the beacon signals received from the working subset of beacon devices.

7. The method of claim 6, wherein the version of the information component of the beacon signal is a copy of the raw information component filtered by the unique frequency pattern of the beacon signal.

8. The method of claim 7, wherein the filtering comprises:
applying a Fourier transform to the received signals in the acoustic frequency range;
applying a comb filter having the frequencies of the frequency pattern of the beacon signal to the transformed received signals;
applying an inverse Fourier transform to the filtered transformed received signals; and
wherein the correlating with the plurality of time-delayed versions of the information component for the beacon signal is applied in the frequency domain on the filtered transformed received signal.

9. The method claim 6, wherein the locations of the differently located beacon devices are stored at the receiver prior to receiving the signals in the acoustic frequency domain;
wherein a representative version of information components of the beacon signals transmitted from the differently located beacon devices are stored at the receiver prior to receiving the signals in the acoustic frequency domain; and
wherein timing information of the transmission of the information components of the beacon signals transmitted from the differently located beacon devices are stored at the receiver prior to receiving the signals in the acoustic frequency domain.

10. The method of claim 6, wherein the method further comprises for each beacon signal transmitted from the working subset of the at least three of the plurality of differently located beacon devices:
carrying out a correlation in frequency of the received beacon signal with a frequency-delayed version of the beacon signal;
identifying a correlation peak from the correlation in frequency, the correlation peak in frequency providing a Doppler measurement of the received beacon signal; and wherein the frequency pattern applied for filtering the received acoustic frequency signals is adjusted based on the Doppler measurement.

11. The method of claim 6, further comprising determining a primary peak from the correlation in time; and
wherein the multilateration is applied on the primary peak;
wherein the multilateration comprises estimating a time of arrival over a direct line of sight of the primary peak based on a current position of the receiver; and
wherein a position of the receiver within the space is determined based on the time of arrival.

12. A system for enabling the determination of a position of a receiver device within a space, the system comprising:
a plurality of beacon devices, each beacon device being configured to transmit a beacon signal having a unique information component and a unique frequency pattern of multiple frequencies, each beacon signal being distinguishable from the beacon signals transmitted from any other of the beacon devices based on a combination of its unique information component and its unique frequency pattern; and
wherein each beacon signal is generated by filtering a raw information component by the frequencies of the unique frequency pattern of the beacon signal;
wherein the transmitting of the information component within each beacon signal transmitted from the beacon devices are synchronized in time; and
wherein the information component is repeated periodically within each beacon signal.

13. The system of claim 12, wherein the unique frequency pattern of multiple frequencies is in the acoustic frequency range.

14. The system of claim 12, wherein the information component of each beacon signal is generated from a maximum length sequence code.

15. The system of claim 12, wherein no frequency of the unique frequency pattern is an even harmonic of any other frequency of the unique frequency pattern.

16. The system of claim 12, wherein the raw information component is upsampled and the filtering is applied to the upsampled information component; and
wherein each beacon device is configured for:
applying a Fourier transform to the upsampled information component;
applying a comb filter having the frequencies of the frequency pattern to the transformed information component; and
applying an inverse Fourier transform to the filtered transformed information component.

17. The system of claim 12, further comprising a receiver device having:
a transducer configured to receive acoustic frequency signals;
a filtering module configured for, for each of a plurality of beacon signals transmitted from a working subset of at least three of the plurality of differently located beacon devices, filtering the received acoustic signals by the frequencies of a frequency pattern of the beacon signal to generate a filtered signal for the beacon signal;
a correlation module configured for, for each of the plurality of beacon signals, carrying out a rolling correlation in time of the filtered signal of the beacon signal with a version of the information component of the beacon signal;
a peak detector module configured for, for each of the plurality of beacon signals, identifying a correlation peak from the rolling correlation for the beacon signal, the correlation peak providing time-delay information for the beacon signal; and
a multilateration module configured for determining a position of the receiver based on the locations of each beacon device of the working subset of beacon devices and the time-delay information of the beacon signals received from the working subset of beacon devices.

18. The system of claim 17, wherein the version of the information component of the beacon signal is a copy of the raw information component filtered by the unique frequency pattern of the beacon signal.

19. The system of claim 18, wherein the filtering module is further configured for:
applying a Fourier transform to the received signals in the acoustic frequency range;
applying a comb filter having the frequencies of the frequency pattern of the beacon signal to the transformed received signals;
applying an inverse Fourier transform to the filtered transformed received signal; and
wherein the correlating with the plurality of time-delayed versions of the information component for the beacon signal is applied in the frequency domain on the filtered transformed received signal.

20. The system of claim 17, wherein the locations of the differently located beacon devices are stored at the receiver prior to receiving the signals in the acoustic frequency domain;
wherein a representative version of information components of the beacon signals transmitted from the differently located beacon devices are stored at the receiver prior to receiving the signals in the acoustic frequency domain; and
wherein timing information of the transmission of the information components of the beacon signals transmitted from the differently located beacon devices are stored at the receiver prior to receiving the signals in the acoustic frequency domain.

21. The system of claim 17, wherein the receiver device further comprises a Doppler tracking module configured for, for each beacon signal transmitted from the working subset:
carrying out a correlation in frequency of the received beacon signal with a frequency-delayed version of the beacon signal; and
identifying a correlation peak from the correlation in frequency, the correlation peak in frequency providing a Doppler measurement of the received beacon signal; and
wherein the frequency pattern applied for filtering the received acoustic frequency signals is adjusted based on the Doppler measurement.

22. The system of claim 17, wherein the receiver device is further configured for determining a primary peak from the correlation in time; and
wherein the multilateration is applied on the primary peak;
wherein the primary peak comprises estimating a time of arrival over a direct line of sight of the primary peak based on a current position of the receiver; and
wherein a position of the receiver device within the space is determined based on the time of arrival.

23. A receiver device comprising:
a transducer configured to receive acoustic frequency signals;
a filtering module configured for, for each of a plurality of beacon signals, filtering the received acoustic signals by the frequencies of a frequency pattern of the beacon signal to generate a filtered signal for the beacon signal;

a correlation module configured for, for each of the plurality of beacon signals, carrying out a rolling correlation in time of the filtered signal of the beacon signal with a version of the information component of the beacon signal;

a peak detector module configured for, for each of the plurality of beacon signals, identifying a correlation peak from the rolling correlation for the beacon signal, the correlation peak providing time-delay information for the beacon signal; and a multilateration module configured for determining a position of the receiver based on the locations of each of a plurality of beacon devices associated to the beacon signals and the time-delay information determined for the beacon signals.

24. A method for enabling the determination of a position of a receiver within a space, the method comprising:

providing a plurality of beacon devices at different locations within said space; and transmitting a beacon signal from each of the beacon devices, each beacon signal having a unique information component and a unique frequency pattern of multiple frequencies, wherein no frequency of the unique frequency pattern is an even harmonic of any other frequency of the unique frequency pattern, each beacon signal being distinguishable from the beacon signals transmitted from any other of the beacon devices based on a combination of its unique information component and its unique frequency pattern; and wherein each beacon signal is generated by filtering a raw information component by the frequencies of the unique frequency pattern of the beacon signal.

25. The method of claim 24, wherein the raw information component is upsampled and the filtering is applied to the upsampled information component; and wherein the filtering comprises:

applying a Fourier transform to the upsampled information component;

applying a comb filter having the frequencies of the frequency pattern to the transformed information component; and applying an inverse Fourier transform to the filtered transformed information component.

26. The method of claim 24, further comprising:

receiving acoustic frequency signals at the receiver;

for each beacon signal transmitted from a working subset of at least three of the plurality of differently located beacon devices:

filtering the received acoustic frequency signals by the frequencies of the frequency pattern for the beacon signal to generate a filtered signal;

carrying out a correlation in time of the filtered signal with a version of the information component of the beacon signal;

identifying a correlation peak from the correlation, the correlation peak providing time-delay information of the beacon signal; and applying multilateration to determine a position of the receiver based on the location of each beacon device of the working subset of beacon devices and the time-delay information of the beacon signals received from the working subset of beacon devices.

* * * * *